(12) United States Patent
Abdelmoneum

(10) Patent No.: US 10,818,723 B2
(45) Date of Patent: Oct. 27, 2020

(54) INFRARED IMAGING APPARATUS AND METHOD

(71) Applicant: SurfaSense LLC, Portland, OR (US)

(72) Inventor: Mohamed Abdelmoneum, Portland, OR (US)

(73) Assignee: SurfaSense LLC, Portland, OR (US)

(*) Notice: Subject to any disclaimer, the term of this patent is extended or adjusted under 35 U.S.C. 154(b) by 0 days.

(21) Appl. No.: 16/254,476

(22) Filed: Jan. 22, 2019

(65) Prior Publication Data

US 2019/0237504 A1 Aug. 1, 2019

Related U.S. Application Data

(60) Provisional application No. 62/622,770, filed on Jan. 26, 2018.

(51) Int. Cl.
*H01L 27/20* (2006.01)
*H01L 27/146* (2006.01)
(Continued)

(52) U.S. Cl.
CPC ........ *H01L 27/14649* (2013.01); *G01J 5/44* (2013.01); *G01N 29/0654* (2013.01); *G01N 29/348* (2013.01); *H01L 27/14625* (2013.01); *H01L 27/14634* (2013.01); *H01L 27/14636* (2013.01); *H01L 27/20* (2013.01);
(Continued)

(58) Field of Classification Search
CPC ........ H01L 27/14625; H01L 27/14634; H01L 27/14636; H01L 27/14649; H01L 27/1465; H01L 27/20; H01L 41/1871; H01L 41/1873; H01L 41/1876; H01L 41/1878; H01L 41/193; G01J 2005/0077; G01J 2005/106; G01J 5/44; G01N 29/0654; G01N 29/2431; G01N 29/245; G01N 29/36; G01N 2291/011
See application file for complete search history.

(56) References Cited

U.S. PATENT DOCUMENTS

| | | | | |
|---|---|---|---|---|
| 5,541,412 A | * | 7/1996 | Tanaka | G01J 5/02 250/330 |
| 5,777,329 A | * | 7/1998 | Westphal | G01J 5/20 250/339.02 |

(Continued)

OTHER PUBLICATIONS

Abdelmejeed, Mamdouh et al., "A CMOS Compatible GHZ Ultrasonic Pulse Phase Shift Based Temperature Sensor", IEEE, MEMS 2018, 4 pgs.

(Continued)

*Primary Examiner* — Stephen W Smoot
(74) *Attorney, Agent, or Firm* — Green, Howard & Mughal LLP

(57) ABSTRACT

A method of imaging infrared light is provided which comprises: exciting ultrasonic waves in a metal pillar (e.g., Cu pillar); measuring the Time-of-Flight (ToF) of the ultrasonic wave in the waveguide; whereas the ToF is a function of incident Infrared light energy on the waveguide, and reporting the infrared light energy to capture an image. An apparatus of imaging infrared light is provided which comprises: a transducer; a waveguide coupled with the transducer; and a pixel electronic circuit coupled to the transducer, wherein the transducer includes one or more of: PZT, LiNb, AlN, or GaN.

22 Claims, 31 Drawing Sheets

(51) Int. Cl.
G01N 29/34 (2006.01)
H04N 5/33 (2006.01)
H01L 41/107 (2006.01)
H01L 41/187 (2006.01)
H01L 41/193 (2006.01)
G01J 5/44 (2006.01)
G01N 29/06 (2006.01)
G01J 5/10 (2006.01)
G01J 5/00 (2006.01)

(52) U.S. Cl.
CPC .......... *H01L 41/107* (2013.01); *H01L 41/187* (2013.01); *H01L 41/1871* (2013.01); *H01L 41/1873* (2013.01); *H01L 41/1876* (2013.01); *H01L 41/1878* (2013.01); *H01L 41/193* (2013.01); *H04N 5/33* (2013.01); *G01J 2005/0077* (2013.01); *G01J 2005/106* (2013.01)

(56) References Cited

U.S. PATENT DOCUMENTS

| | | | | |
|---|---|---|---|---|
| 6,339,220 | B1* | 1/2002 | Oda | G01J 5/20 250/338.1 |
| 7,663,106 | B2* | 2/2010 | Ushimi | G01J 5/02 250/338.1 |
| 9,202,479 | B1* | 12/2015 | Wessel | G11B 5/31 |
| 2004/0140428 | A1* | 7/2004 | Ionescu | G01J 5/20 250/338.1 |
| 2015/0316472 | A1* | 11/2015 | Yon | G08B 21/16 356/437 |

OTHER PUBLICATIONS

Abdelmejeed, Mamdouh et al., "Thermal Wavefront Imaging Using GHz Ultrasonics", 2017 IEEE, 4 pgs.

Carlson, J.E. et al., "Frequency and Temperature Dependence of Acoustic Properties of Polymers Used in Pulse-Echo Systems", 2003 IEEE Ultrasonics Symposium, 4 pgs.

Gokhale, Vikrant J. et al., "Uncooled Infrared Detectors Using Gallium Nitride on Silicon Micromechanical Resonators", Journal of Microelectronic Systems, vol. 23, No. 4, Aug. 2014, 8 pgs.

Kuo, Justin et al., "Towards a CMOS Compatible Ultrasonic Delay Line Memory", 2015 IEEE International Ultrasonics Symposium Proceedings, 4 pgs.

Kuo, Justin C. et al., "64-Pixel Solid State CMOS Compatible Ultrasonic Fingerprint Reader", MEMS 2017, Las Vegas, NV, USA, Jan. 22-26, 2017, 4 pgs.

Lakin, K.M., "A Review of Thin-Film Resonator Technology", IEEE Microwave Magazine, Dec. 2003, 7 pgs.

Lee, Yong J. et al., "Temperature Measurement in Rapid Thermal Processing Using the Acoustic Temperature Sensor", IEEE Transactions of Semiconductor Manufacturing, vol. 9, No. 1, Feb. 1996, 7 pgs.

McSkimin, H.J., "Measurement of Elastic Constants at Low Temperatures by Means of Ultrasonic Waves-Data for Silicon and Germanium Single Crystals, and for Fused Silica", Journal of Applied Physics 24, 988 (1953), Published Jun. 7, 2004, 11 pgs.

Rogalski, A., "Infrared Detectors for the Future", Optical and Acoustical Methods in Science and Technology, vol. 116, No. 3, 2009, 18 pgs.

Sittig, Erhard K., "High-Speed Ultrasonic Digital Delay Line Design: A Restatement of Some Basic Considerations", Proceedings of the IEEE, vol. 56, No. 7, Jul. 1968, 9 pgs.

Stygar, Vern et al., "3D Packaging-Synthetic Quartz Substrate and Interposers for High Frequency Applications", Received from Client Feb. 2019, 5 pgs.

Takahashi, Shin, "TGV and Integrated Electronics", European 3D TSV Summit, Jan. 2015, 24 pgs.

Thadesar, Paragkumar A., "Through-Silicon Vias: Drivers, Performance, and Innovations", IEEE Transactions on Components, Packaging and Manufacturing Technology, vol. 6, No. 7, Jul. 2016, 11 pgs.

Vig, John R., "Uncooled IR Imaging Array Based on Quartz Microresonators", Journal of Microelectronic Systems, vol. 5, No. 2, Jun. 1996, 7 pgs.

* cited by examiner

300

$$f_{o_{Lame}} = \sqrt{\frac{E}{2\rho(1+\upsilon)}} \frac{1}{\sqrt{2}L}$$

320

$$f_{o_{3d}} = \sqrt{\frac{E}{4\rho}} \frac{1}{L}$$

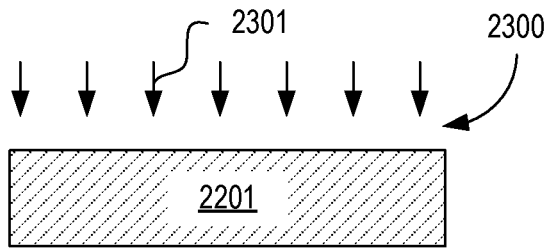
Fig. 23A
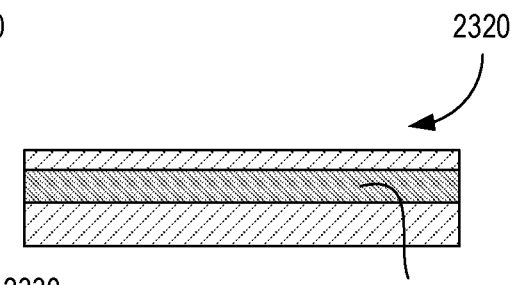
Fig. 23B
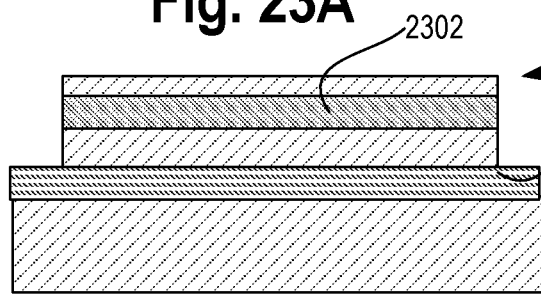
Fig. 23C
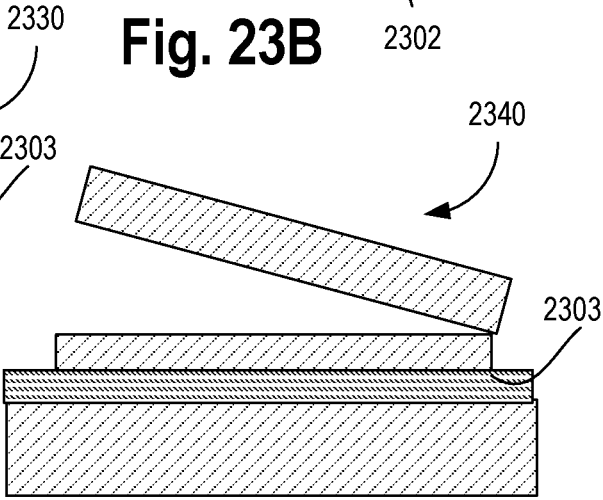
Fig. 23D
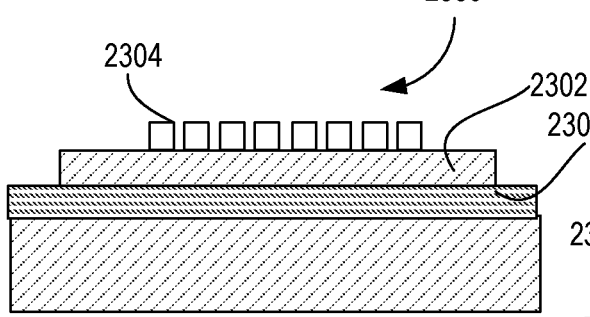
Fig. 23E
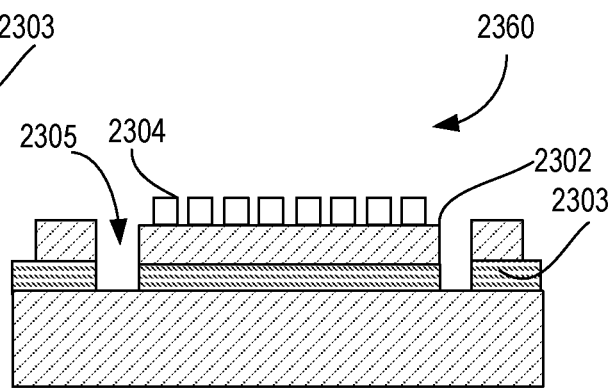
Fig. 23F
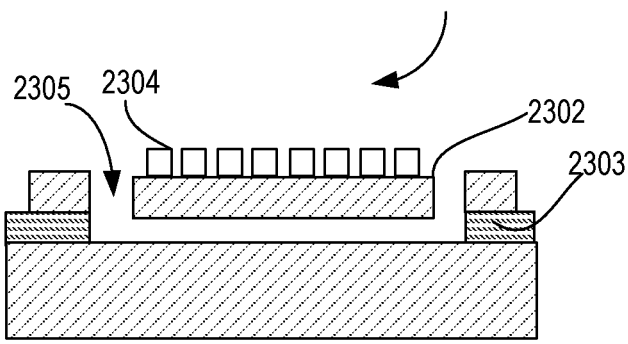
Fig. 23G
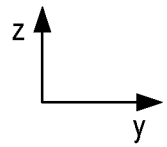

INFRARED IMAGING APPARATUS AND METHOD

CLAIM OF PRIORITY

This application claims priority of U.S. Provisional Patent Application Ser. No. 62/622,770, filed, Jan. 26, 2018, and titled "INFRARED IMAGING APPARATUS AND METHOD," which is incorporated by reference in its entirety.

BRIEF BACKGROUND

Traditional infrared imaging methods (also known as bolometers), measure a resistive change in a thin film, which is correlated with an incident infrared energy. While such techniques are widely used, however, they have two main shortcomings. First, present techniques have low sensitivity, and second, the present techniques have slow imaging frame rate.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 23A-G illustrate a process flow used to form the ultrasound transducer apparatus, in accordance with some embodiments.

DETAILED DESCRIPTION

Figure 1A:
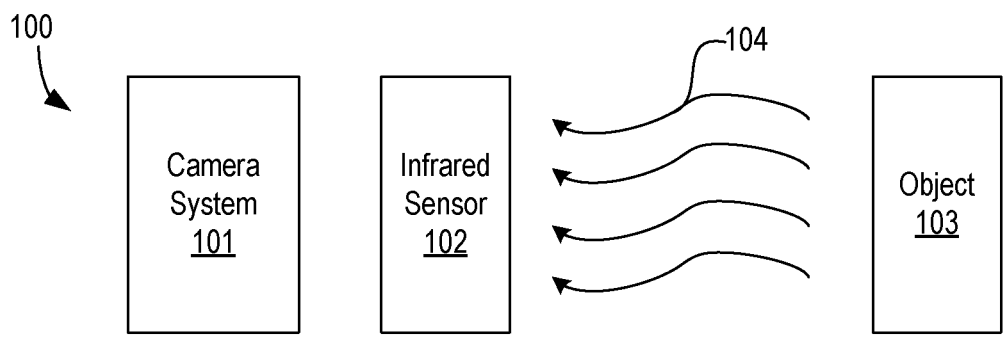
FIG. 1A illustrates an infrared imaging system.

The embodiments of the disclosure describe an infrared imaging apparatus and method for forming such. In some embodiments, the infrared imaging is performed by measuring a change in Time-of-Flight (ToF) of ultrasonic waves (e.g., in GHz) traveling in metal structures (or waveguides) to sense the incident infrared energy. In various embodiments, a guided ultrasonic wave structure is used instead of a thin film. ToF of ultrasonic waves, traveling in the guided structure, change as the speed of sound in the medium changes with change in temperature caused by the incident infrared energy. To be more precise, the Young's modulus of the material will change due to the change in temperature caused by the incident and/or absorbed infrared energy by the material. As the Young's modulus of the material changes, the speed of sound changes and hence ToF of the hypersonic wave will change in proportion to the change in temperature caused by the absorbed infrared energy.

Materials that have high absorptivity to infrared, such as but not limited to, blackened gold or blackened copper have a relatively high absorptivity to change in temperature. For example, a small change in temperature such as but not limited to 25 milli-Kelvin (mK) may change the ToF of a 1 GHz hypersonic wave generated by a thin film of piezoelectric aluminum nitride deposited under a gold pillar by 25 picoseconds. This magnitude of change in ToF can be adequately measured using a delay locked loop (DLL) such as a digital DLL (DDLL) and can be integrated under a thermally isolated pixel.

Unlike bolometers, the thermal noise generated by random temperature variations lead to a femtosecond change in ToF, which reflects as micro-kelvin level noise in the thermal measurement, well below the DDLL noise floor. Thus, the infrared transducer modality of some embodiments may be limited by the noise floor of the low power digital read out electronics, and this limitation is mitigated by digital signal processing in accordance with some embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, acoustic, or magnetic connection between the things that are connected or an indirect connection, through one or more passive or active intermediary devices.

The term "adjacent" here generally refers to a position of a thing being next to (e g, immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, acoustic signal, radiant heat signal, electromagnetic signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device.

The term "between" may be employed in the context of the z-axis, x-axis or y-axis of a device. A device that is between two other devices may be directly connected to one or both of those devices, or it may be separated from both of the other two devices by one or more intervening devices.

Here, the term "backend" or back end of line (BOEL) generally refers to a section of a die which is opposite of a "frontend" or front end of line (FEOL) and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1A illustrates an infrared imaging system 100. Infrared imaging system 100 comprises a camera system 101, an infrared sensor 102, and an object 103. System 100 can detect an infrared energy 104 radiated from object 103. Camera system 101 processes the infrared detected signal from infrared sensor 102, processes the information and may display the image information on a display or a computer screen, or other forms of presenting the information (such as an infrared or night vision goggles). Here, object 103 represents any physical object, which radiates heat.

Example applications of system 100 include: tracking a flying object (e.g., at night), detecting or finding a concealed object (e.g., smuggled objects inside a human body), imaging internal tissues or organs inside the human body, tracking and imaging temperature changes and variations over time on a surface of an object (e.g., an electronic component); or any other application where infrared radiation could be detected and processed to form an image.

Heat is transferred through three methods: conduction, convection or radiation. Conduction occurs when two objects at different temperatures are in contact with each other. Heat flows from a warmer object to a cooler object until both objects are at a same temperature. Conduction is the movement of heat through a substance by the collision of molecules. At the place where the two objects touch, the faster-moving molecules of the warmer object collides with the slower moving molecules of the cooler object. As they collide, the faster molecules give up some of their energy to the slower molecules. The slower molecules gain more thermal energy and collide with other molecules in the cooler object. This process continues until heat energy from the warmer object spreads throughout the cooler object. Some substances conduct heat more easily than other objects. For example, solids are better conductors than liquids and liquids are better conductor than gases. Metals are very good conductors of heat, while air is a very poor conductor of heat.

In liquids and gases, convection is usually the most efficient way to transfer heat. Convection occurs when warmer areas of a liquid or gas rise to cooler areas in the liquid or gas. As this happens, cooler liquid or gas takes the place of the warmer areas, which have risen higher. This cycle results in a continuous circulation pattern and heat is transferred to cooler areas. Both conduction and convection use matter to transfer heat.

Radiation is a method of heat transfer that does not rely on any contact between the heat source and the heated object. For example, heat from the sun is felt by an object even though the object is not touching the sun. Heat can be transmitted though empty space by thermal radiation. Thermal radiation (often called infrared radiation) is a type of electromagnetic radiation (or in this case, invisible light). Radiation is a form of energy transport comprising electromagnetic waves traveling at the speed of light. No mass is exchanged, and no medium is required for electromagnetic waves to travel. Objects emit radiation when high energy electrons in a higher atomic level fall down to lower energy levels. The energy lost during this change in levels is emitted as light or electromagnetic radiation, where the light can be visible or invisible. Energy that is absorbed by an atom causes its electrons to jump up to higher energy levels. Infrared is an invisible electromagnetic wave above the visible light.

Figure 1B:
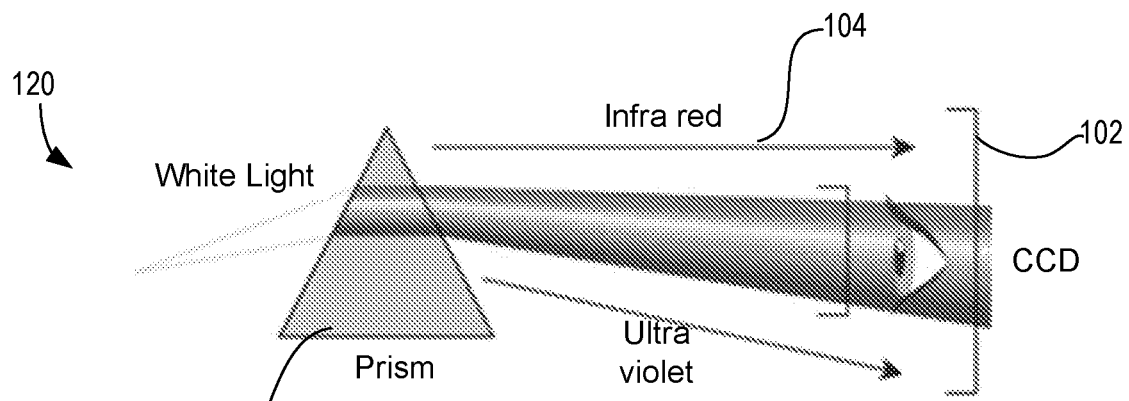
FIG. 1B illustrates light spectrum passing through a prism.

FIG. 1B illustrates apparatus 120 with light spectrum passing through prism 121. White light is composed of distinct colors visible to human eye. Other light components are infrared rays 104 and/or ultra violet rays than can be detected by a charge coupled device or other radiant heat sensors such as infrared sensor 102. When a thermometer or a thermal sensor is placed at an output of prism 121, above the red light, temperature of that thermometer rises up as it is heated by the infrared energy 104. All objects absorb and emit radiation. When the absorption of energy balances the emission of energy, the temperature of an object stays constant. If the absorption of energy is greater than the emission of energy, the temperature of an object rises. If the absorption of energy is less than the emission of energy, the temperature of an object falls. Hence, a picture of an object can be drawn using arrays of thermometers that can absorb the infrared energy of the radiated by the object to create a thermal image or an infrared image of that object.

There are different types of thermometers called detectors used to build the individual pixels in the infrared imager that captures the infrared image. These detectors can be classified as quantum (photo) detectors and thermal detectors. Table 1 illustrates the various kinds of detectors.

TABLE 1

| Detector Type | Advantages | Disadvantages |
| --- | --- | --- |
| Thermal | Light, rugged, reliable, low cost room temperature operation | Low directivity at high frequency slow response (ms order) |
| Photon Intrinsic IV-VI | Available low-gap material | Poor mechanical |
| Photon Intrinsic II-VI | Easy bandgap tailoring Multicolor detectors | Non-uniformity over large area High cost in growth and processing |
| Photon Intrinsic III-V | Good material and dopants Advanced technology | Heteroepitaxy with large lattice mismatch |
| Extrinsic | Very long wavelength operation Relatively simple technology | Extremely low temperature operation |
| Free carriers | Low-cost, high yields Large and close packed 2D arrays | Low quantum efficiency Low temperature operation |
| Quantum Wells: Type I | Matured material growth Good uniformity over large area Multicolor detectors | Low quantum efficiency Complicated design and growth |
| Quantum Wells: Type I | Low Auger recombination rate Easy wavelength control | Complicated design and growth Sensitive to the interfaces |

Figure 1C:
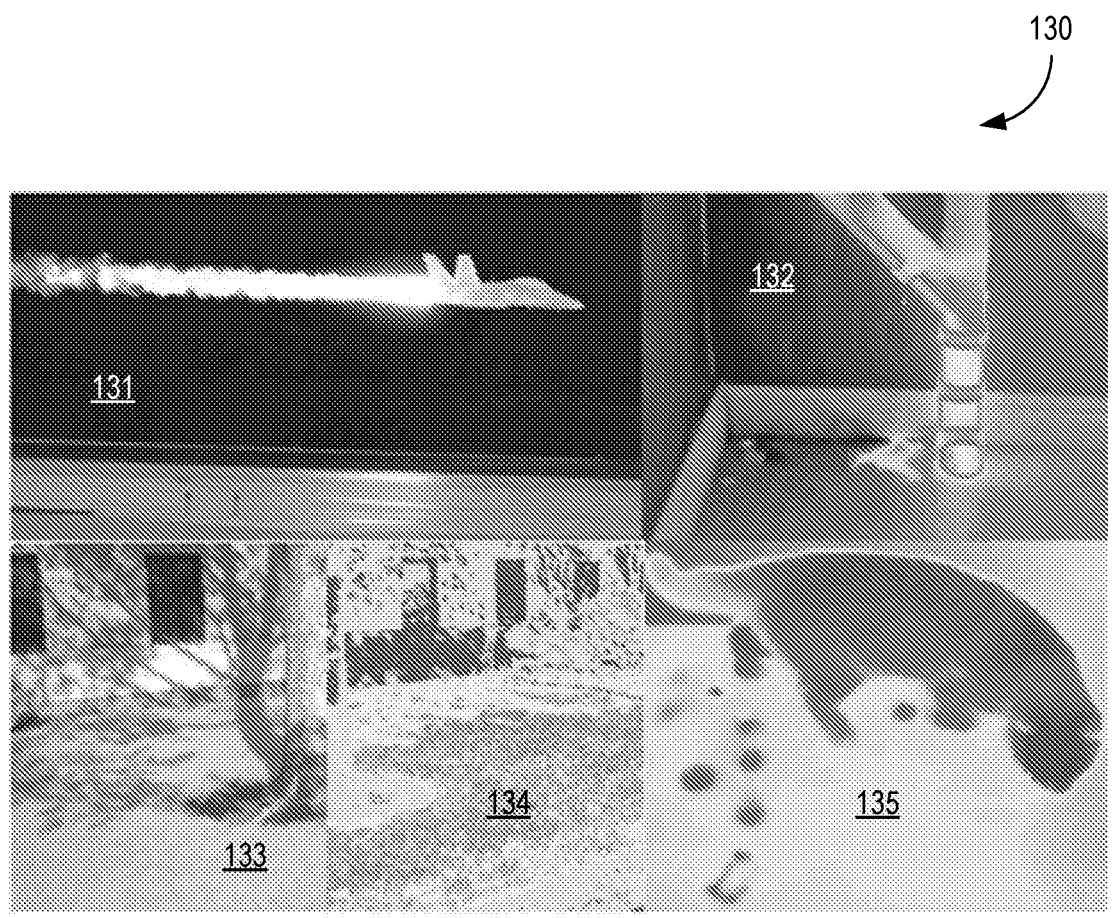
FIG. 1C illustrates an infrared images top left to bottom right are jet fighter, water pipe, tree and a cat.

FIG. 1C illustrates infrared images 130. Image from top left to bottom right are jet fighter 131, water pipe 132, tree 133, grass 134, and a cat 135. Radiation emitted by the objects form infrared images 130.

Some embodiments use the ToF of guided ultrasound traveling in a micro acoustic wave-guide to sense the infrared absorbed by an acoustic waveguide. The guided ultrasound can have high (e.g., 1 GHz or more), medium (e.g., between 500 MHz and 1 GHz) or low frequency (e.g., less than 500 Mhz). The size of the acoustic waveguide and other structure of the sensor depends on the design frequency of the ultrasound. Standard CMOS or other fabrication techniques are used to fabricate arrays of such high frequency guided ultrasound detector pixels to form the infrared imager of various embodiments. These infrared imagers have higher sensitivity (e.g., sensitivity of 30x or better) than state of the art uncooled detectors, including the detectors listed in Table 1. The apparatus of some embodiments has a much higher frame rate with lower power consumption than state of the art detectors including the detectors listed in Table 1. For example, the apparatus of some embodiments result in at least 4x or higher frame rate at equal or lower power and fraction of the cost and complexity compared to the state of the art detectors including the detectors listed in Table 1. Such performance metrics enable novel applications in security and surveillance, insitu medical imaging, robotics, micro robot guiding in a human airway, and other civilian and military applications, for example. Other technical effects will be evident from the various embodiments and figures.

Figure 2A:
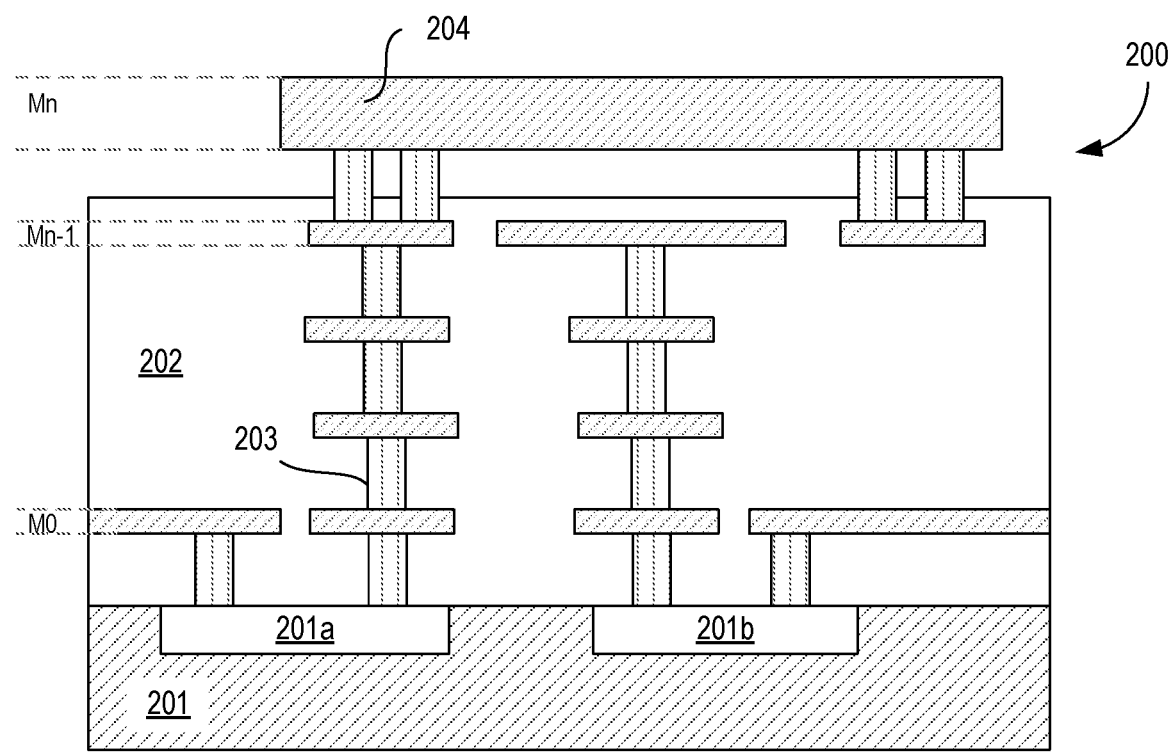
FIG. 2A illustrates a schematic for Complementary metal oxide semiconductor (CMOS) Front End (Transistors) and Back End metal layers.

FIG. 2A illustrates schematic 200 for Complementary metal oxide semiconductor (CMOS) Front End (Transistors) and Back End metal layers. Here, frontend transistors 201a/b are formed in the active area 201 while interconnects are formed in the backend. The metal layer stack shows 'n' metal layers, where 'n' is an integer. These metal layers are generally embedded in oxide 202 and connected with one another though via 203.

Sub-degree Celsius (C) thermal sensors for advanced CMOS temperature measurement using Capacitive Vibrating Radio Frequency Micro-electrical Mechanical systems (RF MEMS) demonstrate very high sensitivity. RF MEMS resonators fabricated using copper in the top metal layer Mn 204 as the resonator structural material enable direct integration within a CMOS chip. Using copper that is inherently sensitive to temperature with one of the highest thermal conductivities would result in very high change in the Young's modulus and hence the resonance frequency. Schematic 200 provides a basic platform to integrate with an array of infrared sensors, in accordance with various embodiments.

Figure 2B:
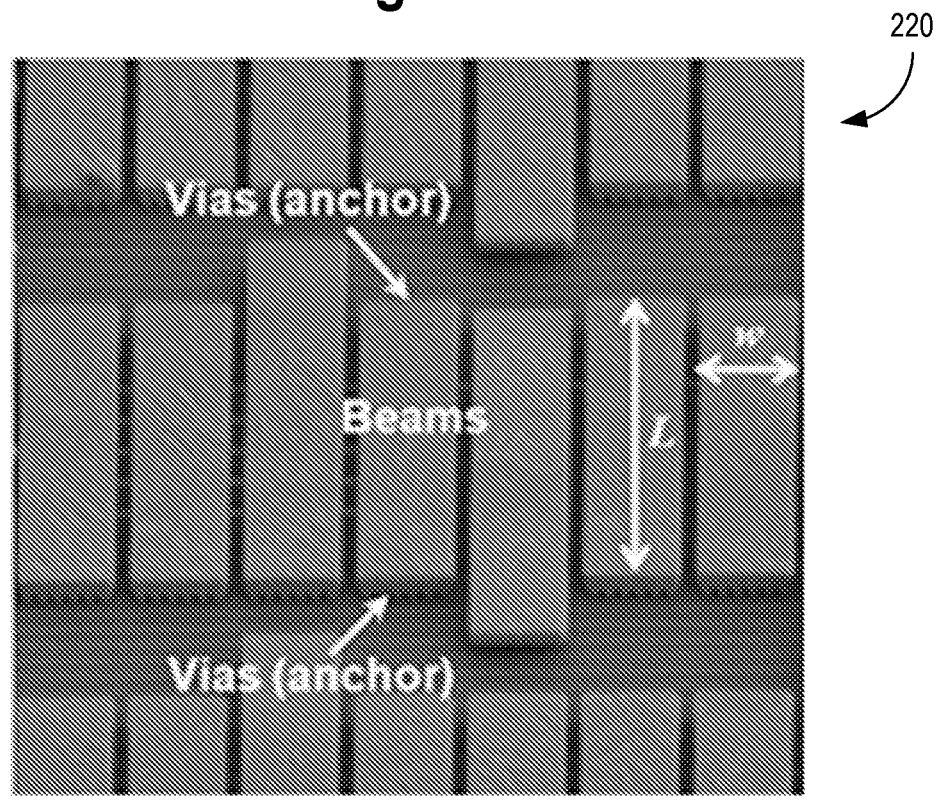
FIG. 2B illustrates a scanning electron microscope (SEM) image of a fabricated Clamped-Clamped Beam Resonator.
Figure 4A:
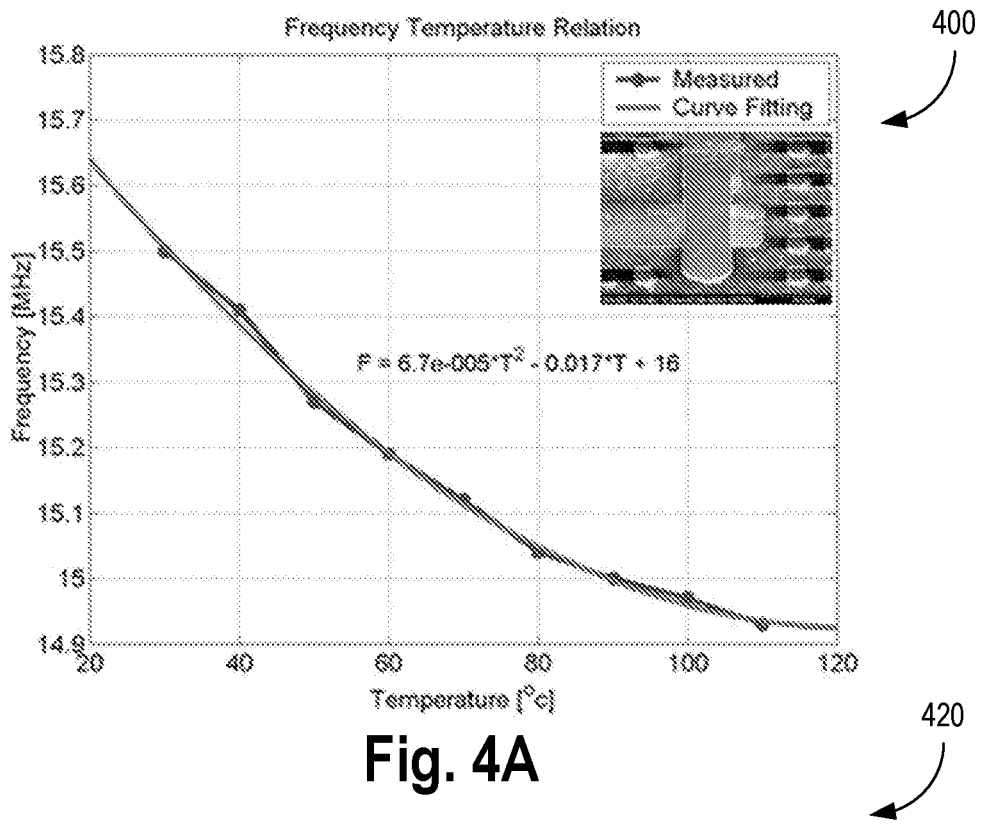
FIG. 4A illustrates a plot showing measured thermal response with high temperature/frequency granularity of 6.7 kHz/° C.

FIG. 2B illustrates a Scanning electron microscope (SEM) image 220 of a fabricated Clamped-Clamped Beam Resonator. In this example, the Clamped-Clamped beam resonator is made out of the copper metal layers of a mainstream 22 nm CMOS process technology. This Clamped-Clamped beam resonator exhibits a 6.6 KHz/degree C. change in resonator resonant frequency as shown in FIG. 4A. Such sensitivity leads to a sub-degree C. accuracy temperature measurement, which is 10x better than state of the art thermal sensors currently used in deep submicron technologies. If the resonator to be operated in two different modes such that each mode has a different thermal sensitivity, then numerical self-trimming can be performed using a firmware (FW) or a digital finite state machine (FSM) thus further tightening the accuracy of the sensor and improving resilience versus aging or other operating conditions, in accordance with some embodiments.

Figure 3A:
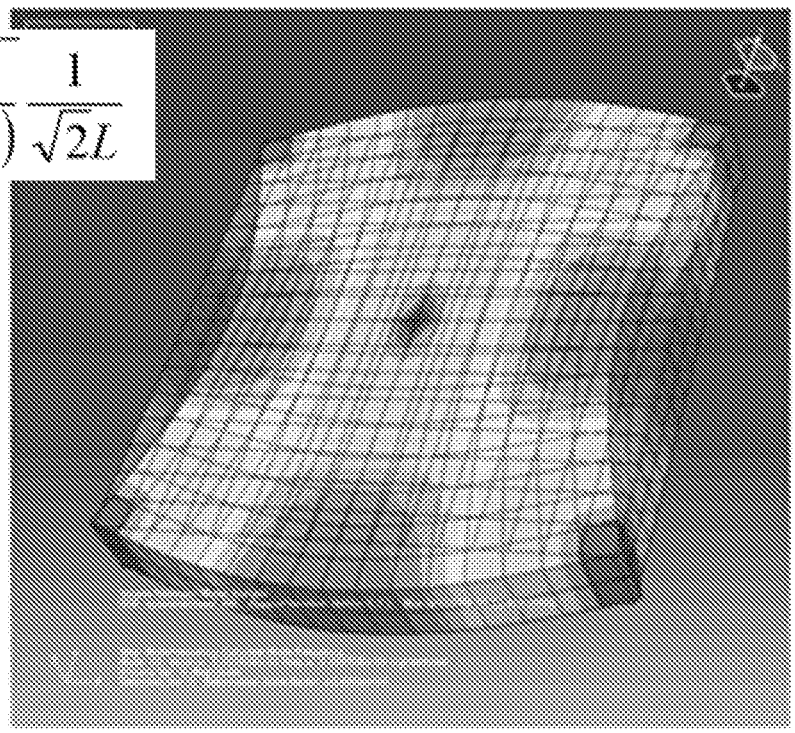
FIGS. 3A-B illustrate plots of Finite Element Simulations, respectively, showing higher order modes of Bulk Mode Square resonators.
Figure 3B:
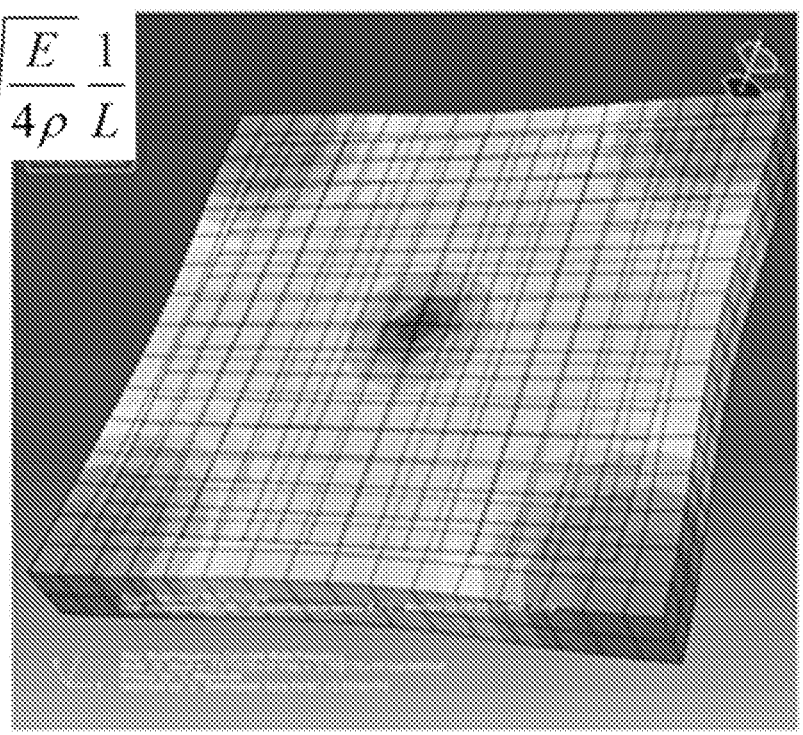

FIGS. 3A-B illustrate plots 300 and 320, respectively, of finite element simulations, respectively, showing higher order modes of bulk mode square resonators. Bulk mode resonators like disk or square resonators are shown operating in Wine-Glass/Lame Mode and Radial/Extensional Mode with Quality Factors (Q-factor) in the order of 100, 000 at frequencies between 70-100 MHz with different thermal sensitivities. Both radial and flexural mode square resonators are demonstrated at lower frequencies with different thermal sensitivities.

Figure 4B:
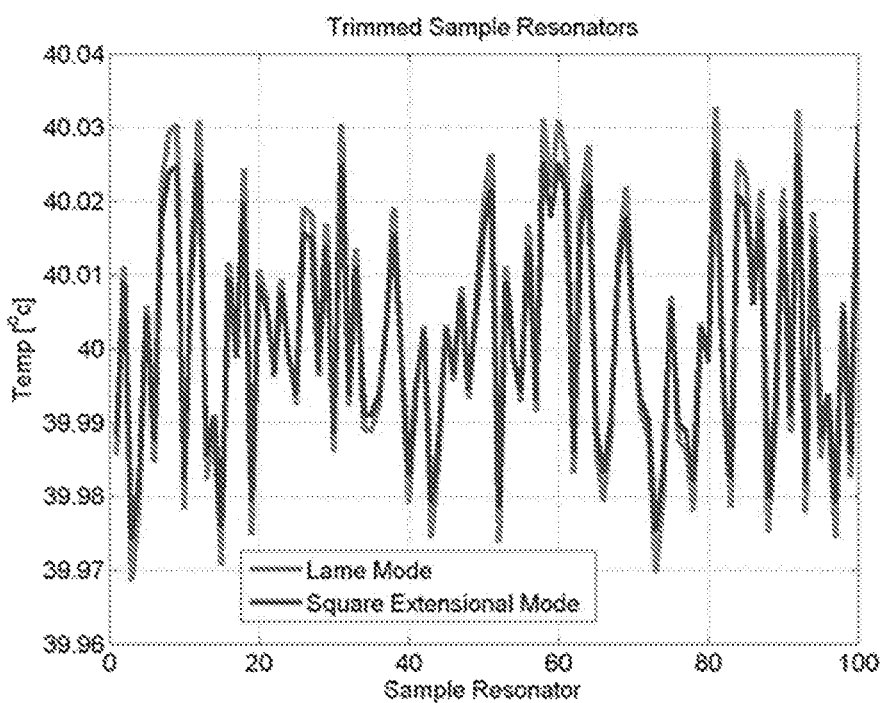
FIG. 4B illustrates a plot with Converged Numerical trimming of a sample of 100 resonators with 10% dimensions variations showing accuracy of less than 50 milli C.

FIG. 4A illustrates plot 400 showing measured thermal response with high temperature/frequency granularity of 6.7 kHz/° C. Here, x-axis is temperature and y-axis is frequency. FIG. 4B illustrates a plot 420 with Converged Numerical trimming of a sample of 100 resonators with 10% dimensions variations showing accuracy of less than 50 milli C. Here, x-axis is resonator sample and y-axis is temperature. Plots 400 and 420 show that Clamped-Clamped beam resonators made out of the copper metal layers of a mainstream 22 nm CMOS process technology exhibit a 6.6 KHz/degree C. change in resonator resonant frequency.

Figure 5:
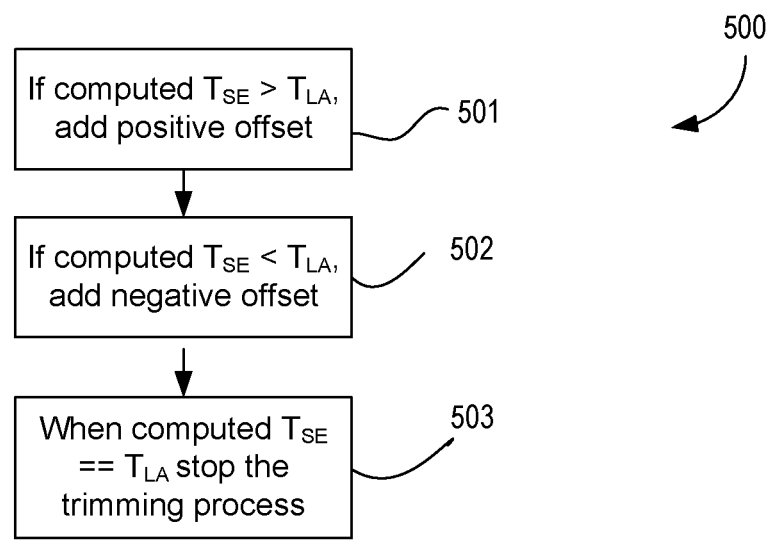
FIG. 5 illustrates a plot and logic showing the Numerical Trimming algorithm.
Figure 5:
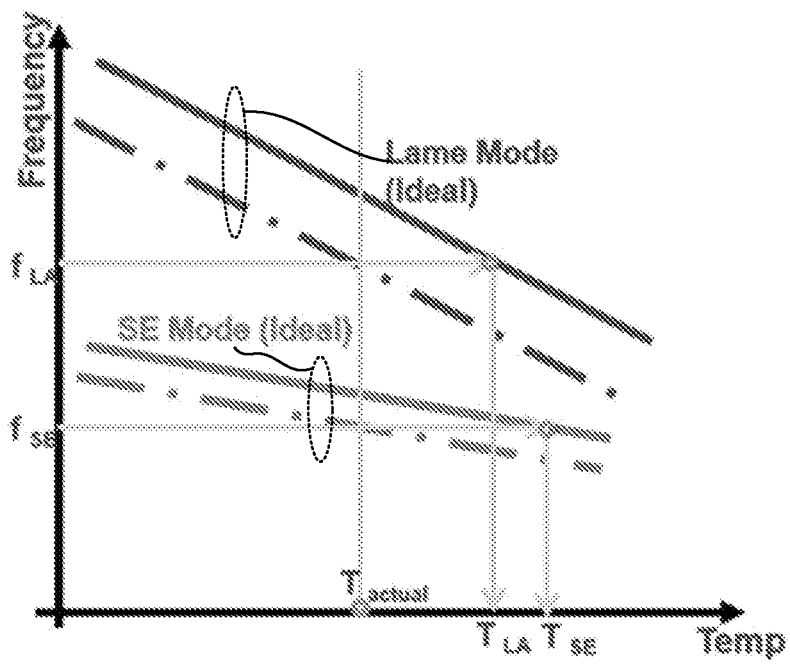

FIG. 5 illustrates a plot and logic 500 showing the numerical trimming scheme. Here, x-axis is temperature and y-axis is frequency. In some embodiments, when the resonator is operated in two different modes such that each mode has a different thermal sensitivity, then numerical self-trimming can be performed using a FW or a digital FSM, thus further tightening the accuracy of the sensor and improving resilience versus aging or other operating conditions, in accordance with some embodiments.

The self-trimming logic of FIG. 5 is illustrated as a flowchart. The blocks of the flowchart can be executed in any order. An error flag is triggered by a FSM when the reported temperature by each mode is not equal. Depending on the sign of the error, a numerical offset is introduced by the FSM to the programed mode temperature sensitivity curve/equation and the delta between the two temperatures between the different modes is calculated and compared. For example, at block 501, when the computed temperature at SE mode for a given frequency is greater than the computed temperature at Lame Mode, a positive offset is added.

Likewise, at block 502, when the computed temperature at SE mode for a given frequency is less than the computed temperature at Lame Mode, a negative offset is added.

The process is repeated in an iterative fashion until the error is minimized and the temperature between the two modes converge to the same value. At that point, trimming is halted (e.g., when temperature at SE mode is equal to the temperature at LA mode) as indicated by block 503. Here, LA mode refers to Lame Mode and SE mode refers to Square Extensional mode. In this example, thermal accuracy on the order of less than 60 milli degree numerical trimming of the thermal sensitivity can be accomplished. Such high accuracy is used for thermal imaging applications, in accordance with various embodiments. Note, the transducer is merely a component in the full system and the noise introduced by the read-out electronics combined with the transducer sensitivity may set the accuracy limit.

Figure 6:
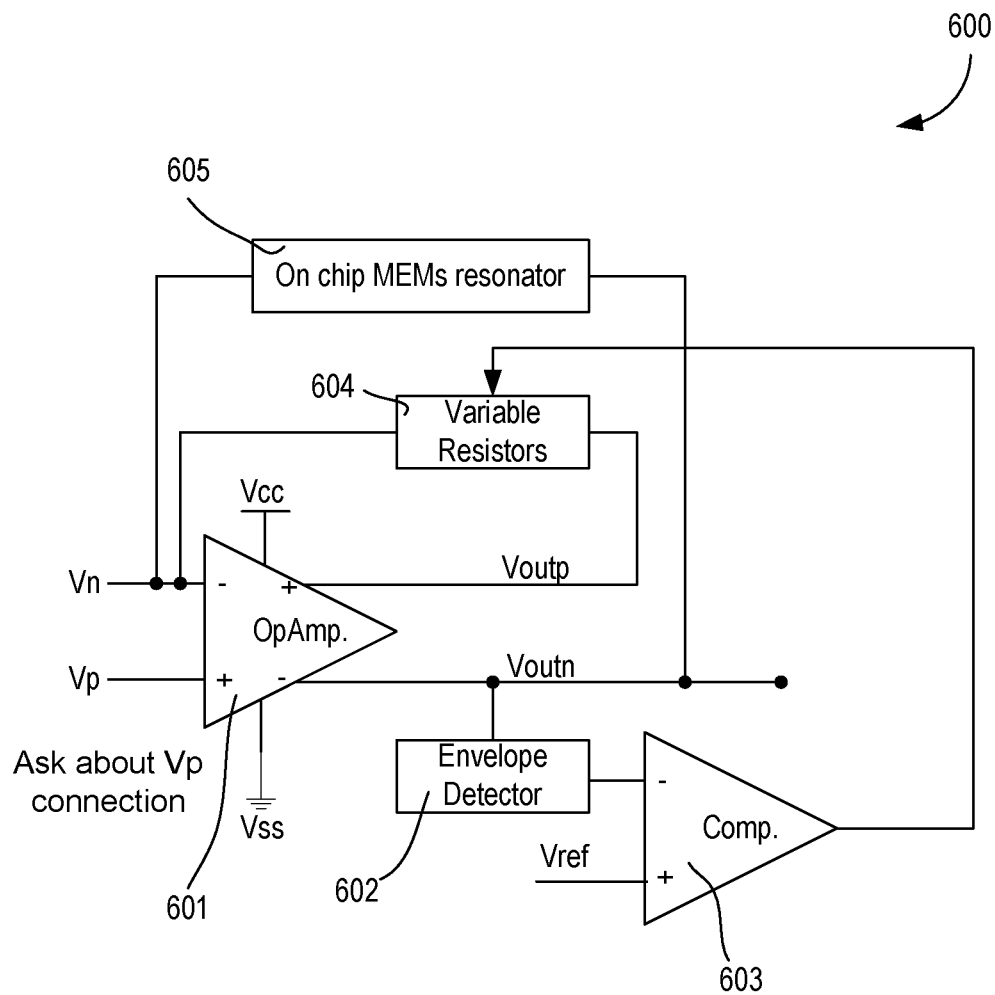
FIG. 6 illustrates a block diagram of a positive feedback loop for sustaining metal resonator oscillations.

FIG. 6 illustrates a block diagram 600 of a positive feedback loop for sustaining metal resonator oscillations. The schematic of FIG. 6 comprises an operational amplifier (OpAmp.) 601, envelope detector 602, comparator 603, resistor(s) 604 with variable resistance, and on-chip (or off-die) MEMs resonator 605 coupled together as shown. In some embodiments, positive feedback loop with a fully differential amplifier generate sustained oscillations as illustrated by FIG. 7.

Figure 7:
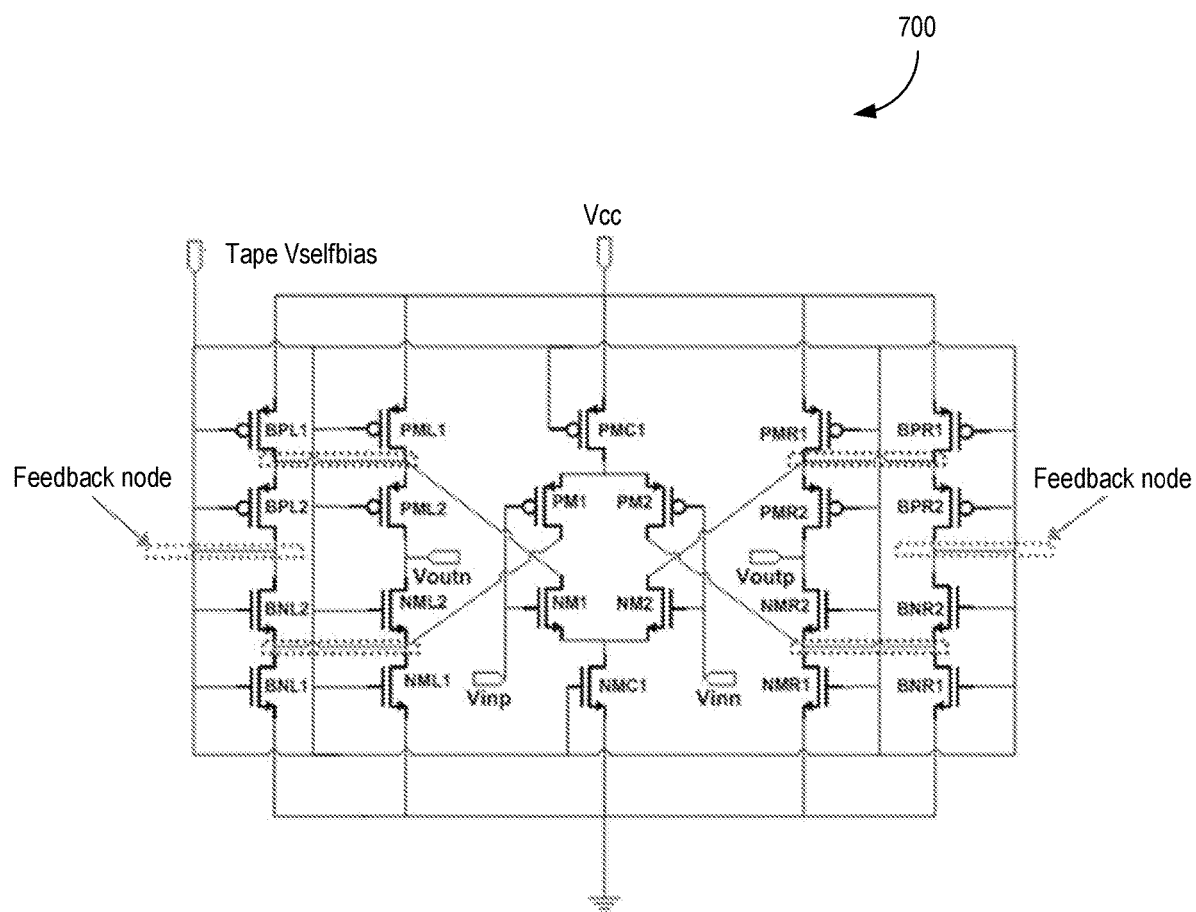
FIG. 7 illustrates a schematic of a fully differential amplifier architecture implemented with the resonator.

FIG. 7 illustrates a schematic of a fully differential amplifier architecture 700 implemented with the resonator. The differential amplifier architecture 700 comprises p-type devices BPL1, BPL2, PML1, PML2, PMC1, PM1, PM2, PMR1, PMR2, BPR1, and BPR2, and n-type devices BNL1, BNL2, NML2, NML2, NM1, NM2, NMC1, NMR1, NMR2, BNR1, and BNR2 coupled together as shown. Architecture 700 is able to sustain oscillations in deep submicron technologies where within die variation is very problematic. The circuit of FIG. 7 is self-biased and immune to variation.

Figure 8:
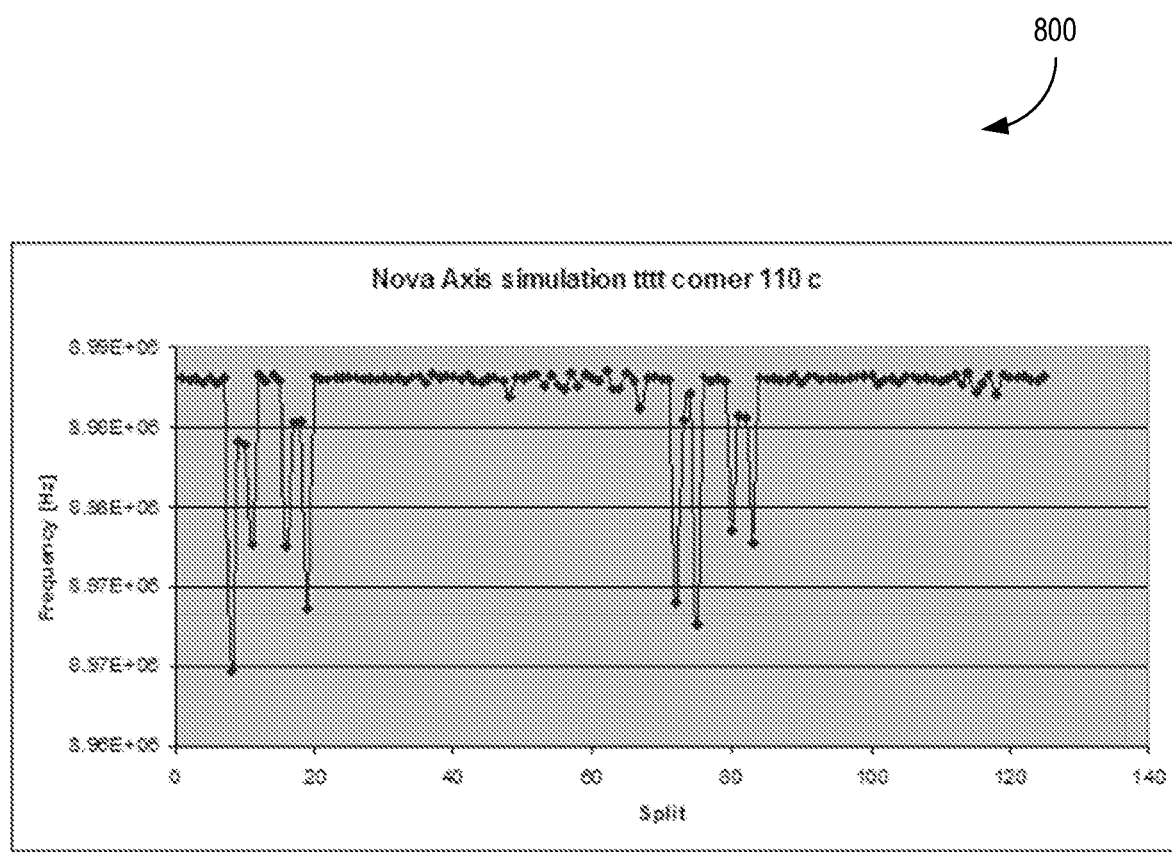
FIG. 8 illustrates a plot showing a 3-Sigma simulation of the effect of variation on the entire elements of the feedback loop with a stressed case of the sixteen feedback transistors varying in opposite directions.

FIG. 8 illustrates plot 800 showing a 3-Sigma (3σ) simulation of the effect of variation on the entire elements of the feedback loop with a stressed case of the sixteen feedback transistors varying in opposite directions. In this example, process variations and thermal noise from the feedback resistors in the sustaining amplifier are the sources of frequency shift/jitter in the output frequency and is bounded to about 1.32 KHz, which translates to about 0.2 C.

As shown, the effect of variation on the elements of the feedback loop realistically leads to a small frequency uncertainty error. However, the stressed case of one of the sixteen feedback transistors shown in FIG. 7 varying with +3σ while the other transistors are varying with negative direction may result in an error of about 2.5 C. This case may be unrealistic as these transistors are interleaved next to each other in the layout and they are almost matched to each other. The circuits of FIGS. 6-7 provide a low cost, low performance infrared red imaging apparatus.

The high thermal sensitivity of the Young's modulus of elasticity of copper or even gold is attractive to sense infrared absorption when a low thermal noise transducer with an inherently digital read-out electronics is used.

FIGS. 6-8 illustrate how an integrated micro-electro-mechanical resonator is integrated in an amplifier feedback loop to create an oscillator performing the function of a thermal sensor and how digital trimming can be used to self-calibrate the sensor to deliver sub degree C. accuracy. Although this is very accurate for chip temperature monitoring and can be used to sense the radiant infrared energy, the time required to heat the resonator and capture the change of Hz to Killo Hertz of frequency will be in the seconds to 100 of milli seconds resulting in very low frame rate. To mitigate this issue, various embodiments use the ToF of guided very high frequency ultrasound waves to sense milli-Kelvin temperature change due to incident infrared energy in a picosecond/milli-Kelvin.

Figure 9:
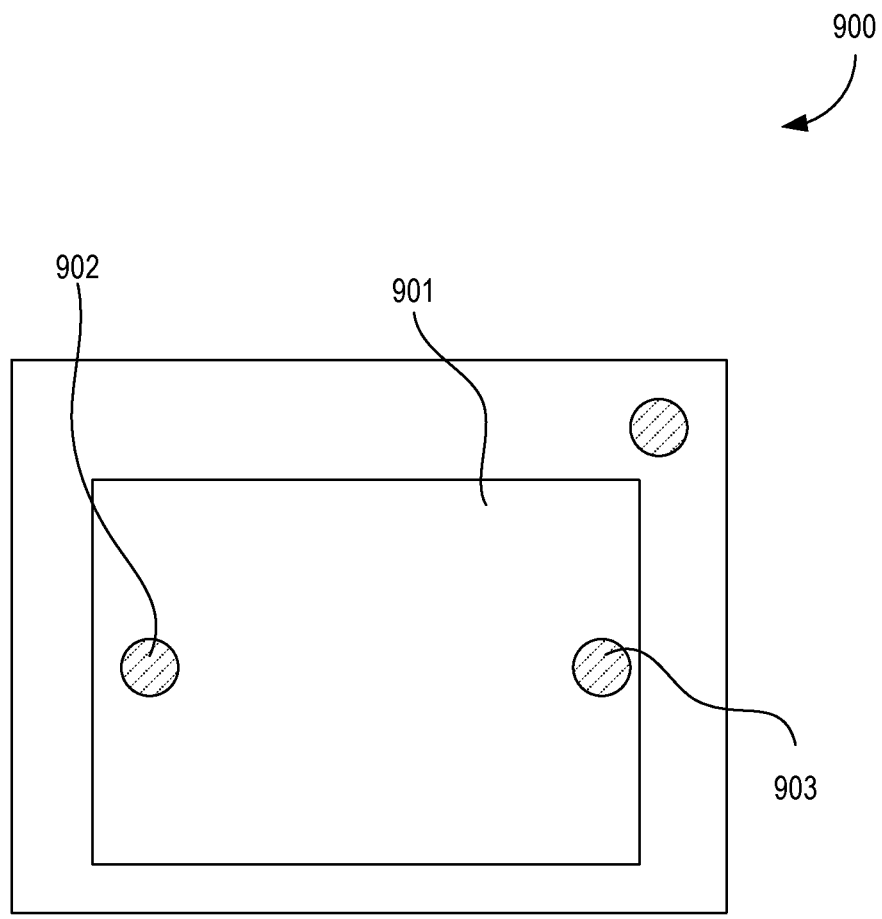
FIG. 9 illustrates a glass sheet with two piezoelectric transducers, in accordance with some embodiments.

FIG. 9 illustrates apparatus 900 comprising a glass sheet 901 with two piezoelectric transducers 902 and 903, in accordance with some embodiments. Propagation velocity of ultrasonic waves traveling in a medium is proportional to its Young's modulus of elasticity. In this example, a Lamb wave is excited in glass plate 901 using a piezoelectric transducer 902 may travel in glass plate 901 and detected at the opposite end using a second piezoelectric transducer 903.

As the propagation velocity changes due to the change in the Young's modulus of the glass with the temperature of plate 901, the traveling wave may experience change in the arrival time to the other end of glass plate 901. To quantify such a change, a hot air gun is mounted at a distance of about two feet from glass plate 901 and pointed at the glass plate. Temperature is recorded using a contactless infrared thermometer and the received ultrasonic wave is recorded over a 1 msec period.

Figure 10A:
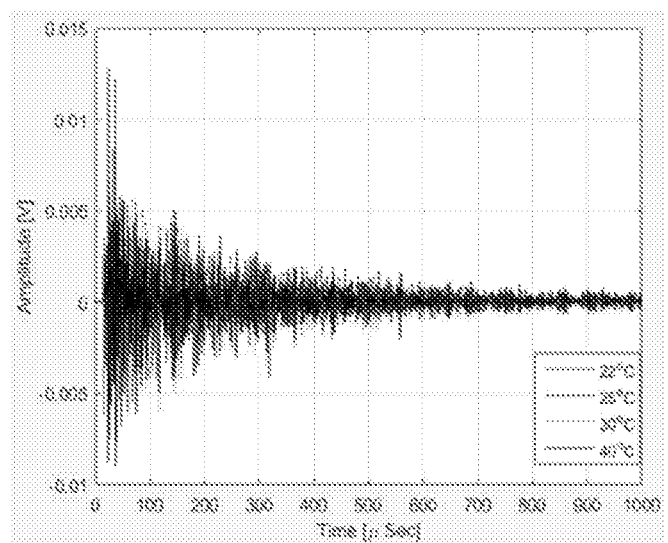
FIGS. 10A-C illustrate plots, respectively, showing measured time domain signal traveling across the glass plate and going through multiple reflections from the sides of the plate at different temperatures of the glass plate.
Figure 10B:
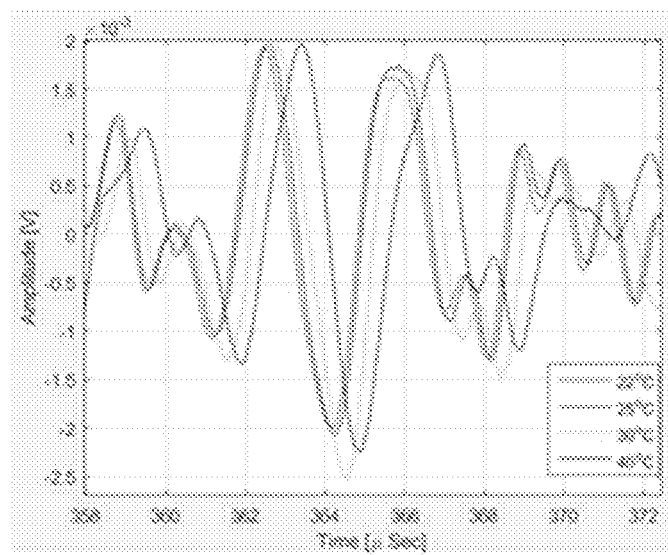
Figure 10C:
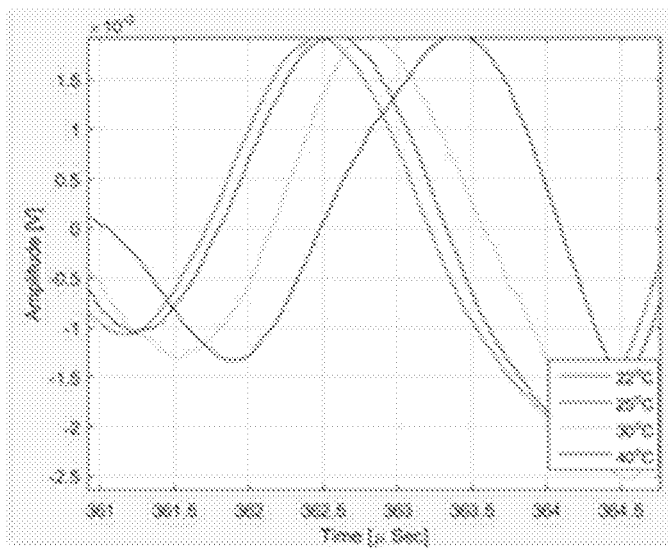

FIGS. 10A-C illustrate plots 1000, 1020, and 1030, respectively, showing measured time domain signal traveling across glass plate 901 and going through multiple reflections from the sides of the plate at different temperatures of glass plate 901. This data points to an average change in the time of arrival with respect to temperature of about 0.01 pico sec/100 milli degree C.

Glass is a material with low thermal conductivity and low dependence of Young's modulus with temperature but this simple experiment demonstrates the validity of the underlying phenomena of various embodiments in using the change in the speed of sound with temperature as a new modality for infrared imaging. The above examples are provided as exemplary embodiments, and other similar material with desired characteristics can also be utilized to achieve similar results.

Using a material that has high infrared absorption coefficient, high thermal conductivity and a Young's modulus that has strong dependence on temperature like copper or other materials like blackened gold, then the speed of the propagating sound wave may be strongly dependent on temperature.

Figure 11A:
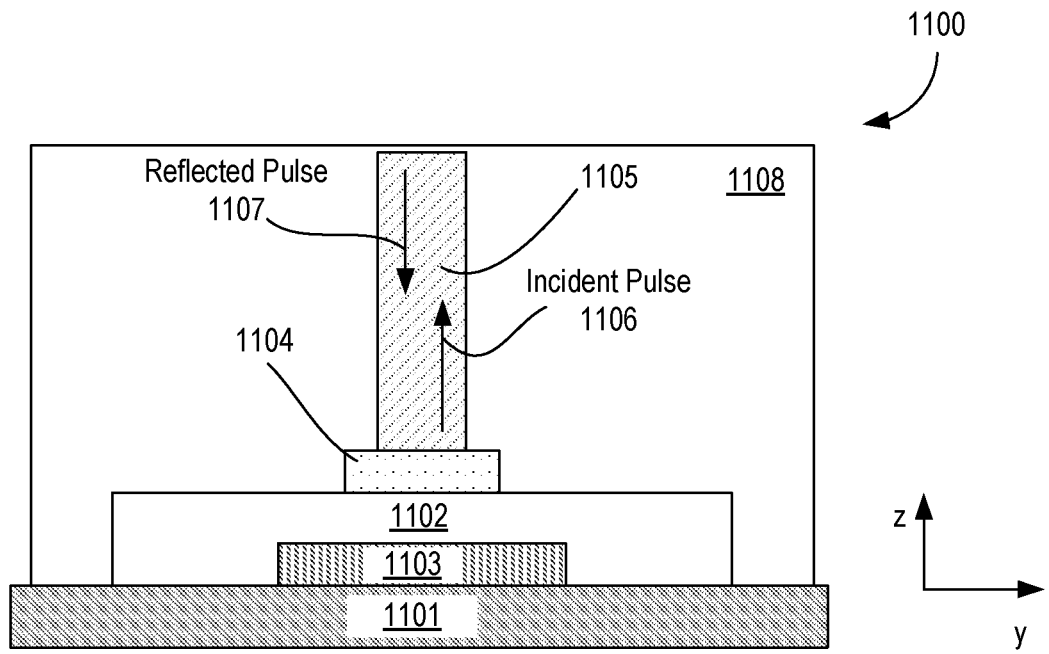
FIG. 11A illustrates a cross-section of a thin film of piezoelectric transducer with a metal column/pillar on top of the transducer, according to some embodiments of the disclosure.

FIG. 11A illustrates a cross-section of apparatus 1100, which comprises thin film of piezoelectric transducer with a metal column/pillar on top of the transducer, according to some embodiments of the disclosure. In some embodiments, apparatus 1100 comprises active region 1101 for pixel electronics and other logic; structure 1102; insulating gap 1103; transducer 1104; and waveguide 1105.

In some embodiments, active region 1101 may have metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be in active region 1101 without departing from the scope of the embodiments.

In some embodiments, structure 1102 comprises material suitable for thermal isolation. Materials like silicon oxide and silicon nitride, titanium, Tantalum which have orders of magnitude higher thermal resistance than silicon or metals can be used to construct the mechanical tethers or structure 1102 delivering both structural anchors and thermal insulation/isolation from substrate 1101.

In some embodiments, insulating gap 1103 is formed between structure 1102 and active region 1101. In some embodiments, air is filled in insulating gap 1103. In other embodiments, other material that than air can be used in region 1103 to isolate transducer pixel from silicon wafer and read out electronics of active region 1101. Gap 1103 can be vacuum using insitu vacuum packaging technique providing the best isolation or filled with noble gasses like argon or neon.

In some embodiments, transducer 1104 is formed over structure 1102 and above insulating region 1103. In some embodiments, transducer 1104 comprises piezoelectric material. In some embodiments, transducer 1104 comprises one or more of: Barium titanate ($BaTiO_3$), Lead zirconate titanate (PZT), Potassium niobate ($KNbO_3$), Sodium tungstate ($Na_2WO_3$), $Ba_2NaNb_5O_5$, $Pb_2KNb_5O_{15}$, Zinc oxide (ZnO)-Wurtzite structure, Sodium potassium niobate (($KNa)NbO_3$) (or NKN), Bismuth ferrite ($BiFeO_3$), Sodium niobate $NaNbO_3$, Bismuth titanate $Bi_4Ti_3O_{12}$, Sodium bismuth titanate $Na_{0.5}Bi_{0.5}TiO_3$, LiNb, AlN, or GaN. any bulk or nanostructured semiconductor crystal having non central symmetry, such as the Group III-V and II-VI materials, Polyvinylidene fluoride (PVDF), and diphenylalanine peptide nanotubes (PNTs). In some embodiments, transducer 1104 has a thickness along the z-direction of about 20 nm (nanometers) to 40 nm.

In some embodiments, waveguide 1105 is formed over or adjacent to transducer 1104. As discussed with various embodiments, waveguide 1105 can be formed with copper or gold, and other similar elements and their alloys. In some embodiments, when using a material for waveguide 1105 that has high infrared absorption coefficient, high thermal conductivity and a Young's modulus that has strong dependence on temperature like copper or other materials like blackened gold, graphite, then the speed of the propagating sound wave may be strongly dependent on temperature. In some embodiments, waveguide 1105 comprises one of: metal including one or more of copper, gold, graphene, or tungsten; dielectrics including Hf, Ga, or N; high-k dielectric; material with infrared absorption coefficient; or material with thermal conductivity and a Young's modulus that is sensitive to temperature change.

If an ultrasound wave is launched in metal column 1105 from transducer 1104, the sonic wave 1106 (or incident pulse) may travel through the metal column 1105 till it reaches the metal-air interface where it may reflect with a close to unity reflection coefficient due to the large acoustic impedance mismatch between the metal column and air. The interface between metal waveguide 1105 and air can also be interface between metal waveguide 1105 and vacuum, or metal waveguide 1105 and other gases. The reflected wave 1107 (or reflected pulse) may then travel back through metal column 1105 (or waveguide) and may be detected by the piezoelectric transducer 1104 generating a current signal.

Figure 11B:
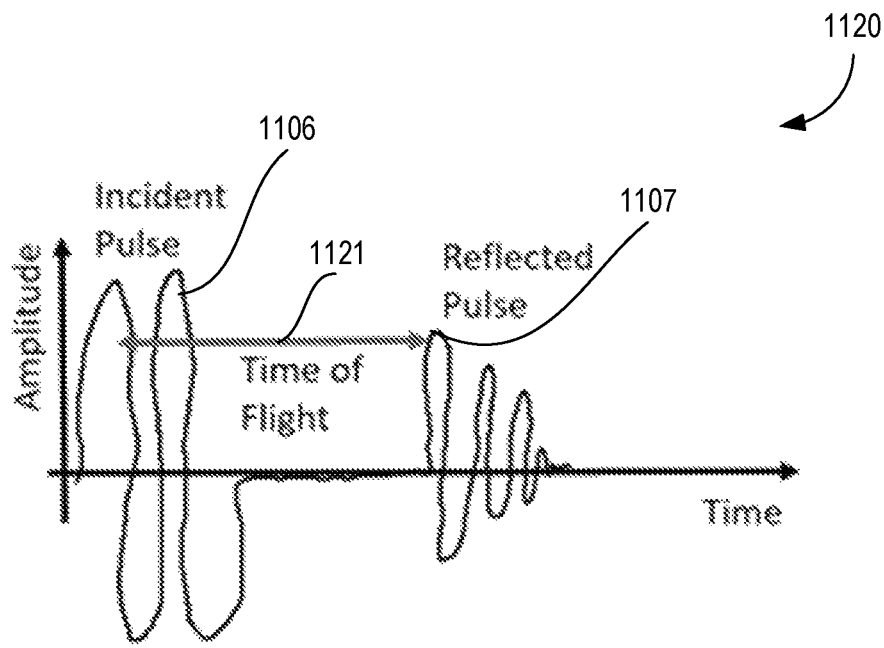
FIG. 11B illustrates a sketch showing the incident pulse generated by the transducer that travels through the metal pillar and then reflects from the metal air interface.

The total time between the generation of incident pulse 1106 and the generation of the electrical output from reflected pulse 1107 is the total Time-of-Flight (ToF) of the sonic wave in the acoustic waveguide 1105 which in one embodiment is realized as a metal column. FIG. 11B illustrates a sketch 1120 showing incident pulse 1106 generated by transducer 1104 that travels through metal pillar 1105 and then reflects from the metal air interface. The ToF is equal to twice the length of the metal column (e.g., one length for the forward trip and one length for the reflected trip) divided by the ultrasonic wave velocity in the metal column. Since the sonic velocity is dependent on temperature, then the ToF may change with temperature as well. In some embodiments, region 1108 around waveguide 1105 is covered by transparent infrared material like air, glass, or silicon.

For the exemplary embodiment discussed above, the sensitivity is about 25 picoseconds per 25 milli Kelvin as shown in Table 2.

TABLE 2

| Temp. in C. | Temp. in K | C speed of source in m/S | C TCF in ppm/K | Delta C in m/S | Time to travel 500 um round trip in ns | Delta in round trip time in ns | Change in round trip time due to 25 mK in ns |
| --- | --- | --- | --- | --- | --- | --- | --- |
| 20 | 293.15 | 1740 | | | 574.71 | | |
| 25 | 298.15 | 1754.77 | 1697.70 | 14.77 | 569.88 | −4.84 | −0.024 |
| 30 | 303.15 | 1769.43 | 1670.65 | 14.66 | 565.15 | −4.71 | −0.024 |
| 35 | 308.15 | 1783.96 | 1642.56 | 14.53 | 560.55 | −4.60 | −0.023 |
| 40 | 313.15 | 1798.38 | 1616.18 | 14.42 | 556.06 | −4.93 | −0.022 |
| 45 | 318.15 | 1812.68 | 1590.32 | 14.30 | 551.67 | −4.39 | −0.022 |
| 50 | 323.15 | 1826.86 | 1565.42 | 14.19 | 547.39 | −4.28 | −0.021 |
| 55 | 328.15 | 1840.94 | 1541.40 | 14.08 | 543.20 | −4.19 | −0.021 |
| 60 | 333.15 | 1854.92 | 1517.94 | 13.97 | 539.11 | −4.09 | −0.020 |
| 65 | 338.15 | 1868.78 | 1495.18 | 13.87 | 535.11 | −4.00 | −0.020 |

In this example, the change in ToF is substantial and is measured using a digital delay locked loop (DDLL).

Figure 11C:
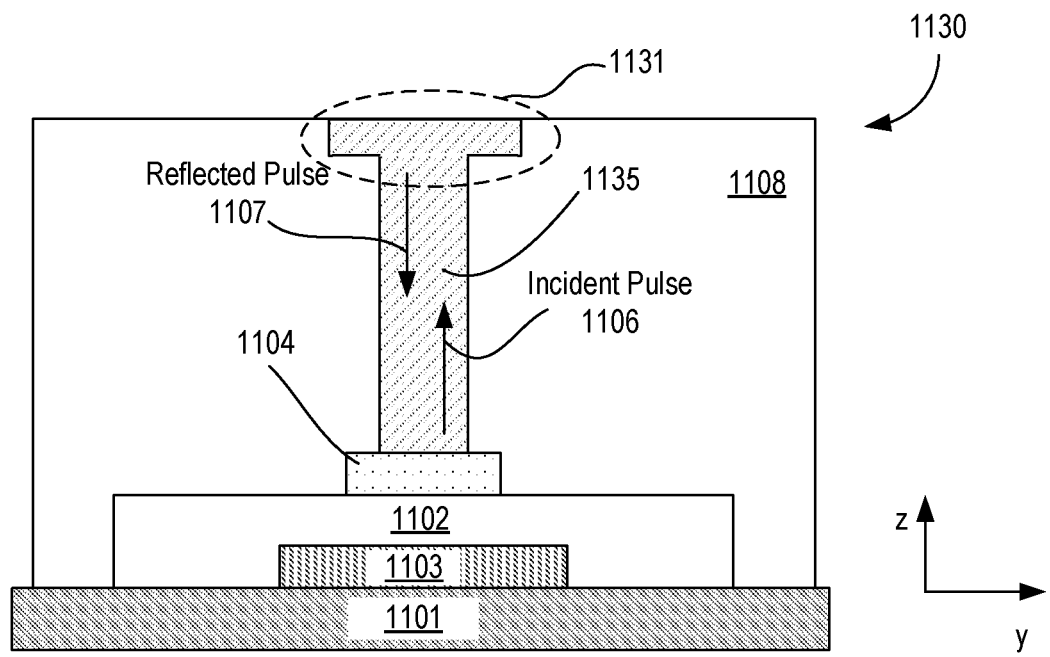
FIG. 11C illustrates a cross-section of a thin film of piezoelectric transducer with a metal column/pillar on top of the transducer, wherein the metal column/pillar has a rectangular end, according to some embodiments of the disclosure.

FIG. 11C illustrates a cross-section 1130 of a thin film of piezoelectric transducer with a metal column/pillar on top of the transducer, wherein the metal column/pillar has a rectangular end 1131, according to some embodiments of the disclosure.

Figure 11D:
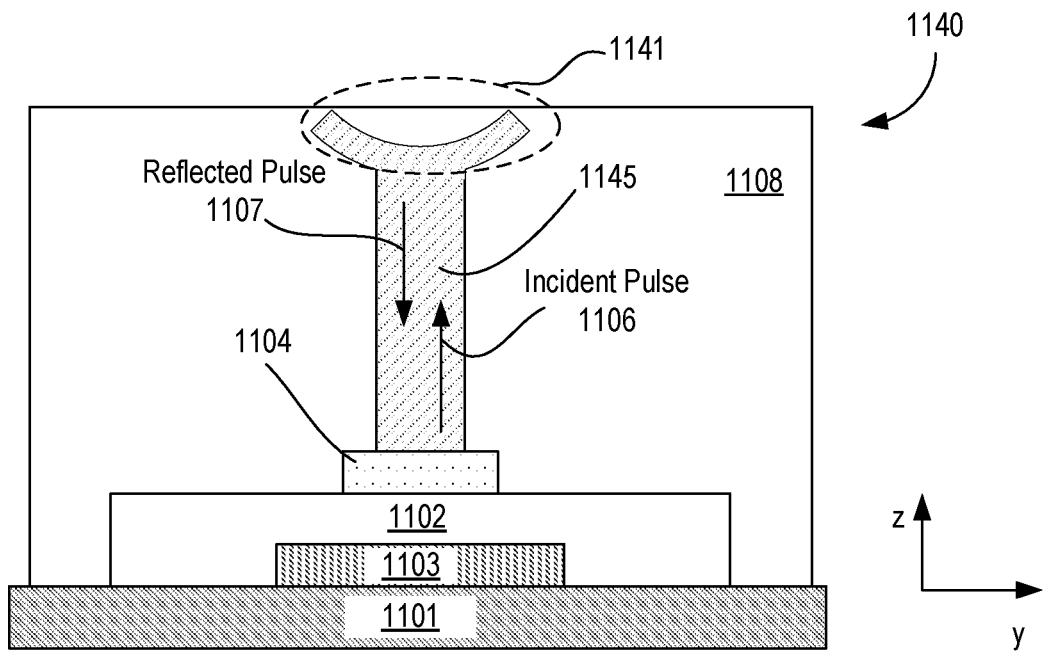
FIG. 11D illustrates a cross-section of a thin film of piezoelectric transducer with a metal column/pillar on top of the transducer, wherein the metal column/pillar has a concave end, according to some embodiments of the disclosure.

FIG. 11D illustrates a cross-section 1140 of a thin film of piezoelectric transducer with a metal column/pillar on top of the transducer, wherein the metal column/pillar has a concave end 1141, according to some embodiments of the disclosure. Various shapes for the end of acoustic waveguide 1105 may be used to capture infrared radiation efficiently.

Figure 12A:
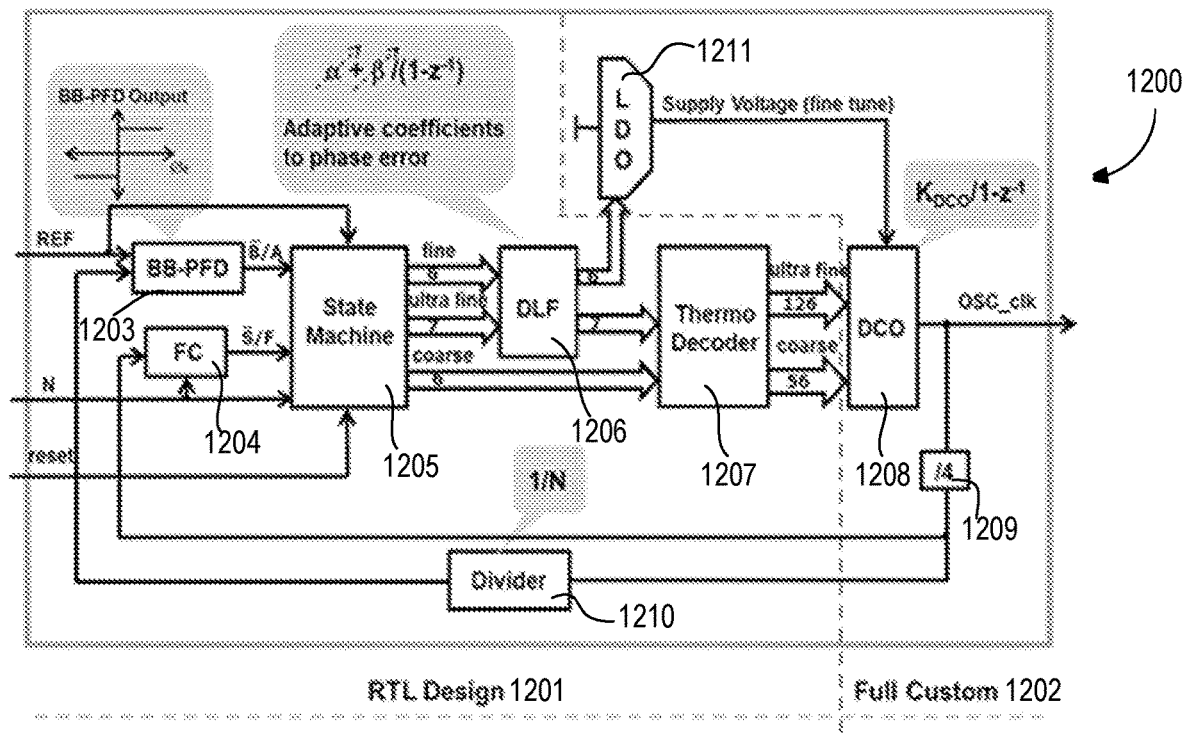
FIGS. 12A-B illustrate block diagram of a Fully Digital Phase Locked Loop (ADPLL) and a corresponding die micrograph of a fabricated ADPLL.
Figure 12B:
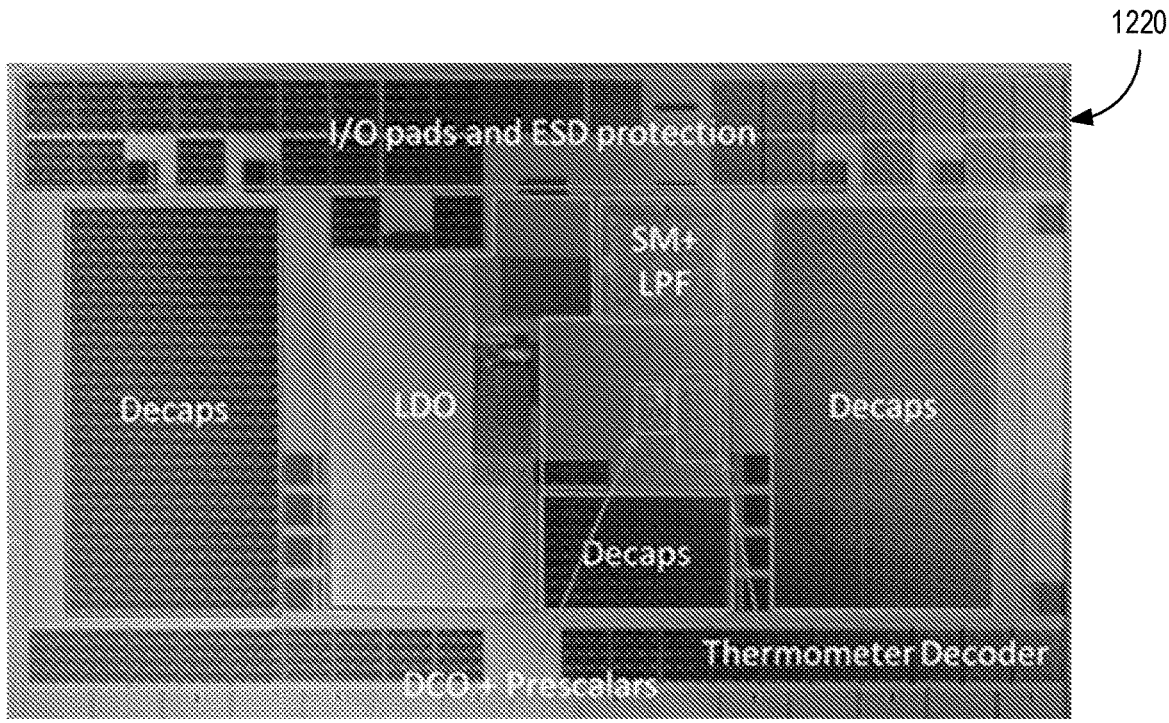

FIGS. 12A-B illustrate block diagram of a Fully Digital Phase Locked Loop (ADPLL) 1200 and a corresponding die micrograph 1220 of a fabricated ADPLL. ADPLL comprises two portions. The first portion is 1201, which can be synthesized using a hardware description language (such as Verilog, VHDL). The second portion 1202 is a full custom design where devices are sized carefully according to process technology. In some embodiments, first portion 1201 comprises phase frequency detector (e.g., a bang-bang PFD) 1203, frequency counter (FC) 1204, state machine 1205, digital loop filter 1206; decoder 1207; and divider 1210. In some embodiments, second portion 1202 comprises digitally controlled oscillator (DCO) 1208, divider 1209 and supply generator 1211 (e.g., low dropout regulator LDO).

PFD 1203 compares reference clock REF and feedback clock from divider 1210. DC 1204 receives output from divider 1209 to determine the frequency of oscillating clock OSC_clk. The outputs of PFD 1203 and FC 1204 are received by state machine 1205 which generates fine, ultra-fine, and coarse codes for controlling the frequency of DCO 1208. A reset signal may reset state machine 1205 to an initial state by. Here, 'N' may be a divider ratio which is used by state machine 1205 to determine the initial values of fine, ultra-fine, and coarse codes. In some embodiments, DLF 1206 filters the fine and ultra-fine codes. The output of DLF 1206 is used to control the fine power supply or clean power supply from LDO 1211. Decoder 1207 converts the filtered fine codes and coarse codes to thermometer codes. The output (thermometer encoded fine and coarse codes) from decoder 1207 are then used to control the oscillating frequency of DCO 1208. DCO 1208 can be an LC-oscillator and/or any other kind of oscillator.

For the above example, DLL 1200 having a resolution of, for example, 4 picoseconds or less is used. Performance of the overall imager system may be set by the noise sources in transducer 1104 and in detection circuit(s) in active region 1101. The detection circuits include DLL 1200. The thermal noise on transducer side 1104 (and/or other components of infrared sensor of apparatus 1100) manifests itself as temperature fluctuations and hence change in speed of sound that may be reflected as jitter in the ToF. For example, for a 500 µm long circular gold pillar 1105 with 10 µm radius, the maximum thermal noise is about 4 micro Kelvin which reflects as itself as less than femtosecond ToF change. Hence, the thermal noise limit on the transducer side may be negligible.

Various embodiments may not rely on any semiconductor properties, and as such, all other noise sources from carrier recombination, shots noise or other sources of semiconductor noise may not affect the transducer sensitivity to the absorbed infrared energy. In some embodiments, on the readout electronics side in active region 1101, a time scale resolution measurement is performed which can be implemented using an All Digital Delayed Locked Loop (e.g., ADDLL 1200) or All Digital Phase Locked Loop (ADPLL, not shown). A person skilled in the art would appreciate that other measurement techniques using delay lines, analog PLLs, analog DLLs, can also be used. In some embodiments, the measurement is inherently digital and the imager sensitivity is set by the sensitivity of the digital time resolution. In some embodiments, measurement of ToF can be implemented in an all-digital fashion using All Digital Delay Locked Loops or Phase Locked Loop which continuously improves by semiconductor scaling from the area, power and resolution aspects.

Some embodiments bring the novel change in ToF with absorbed infrared energy modality with a CMOS thin film to excite sonic waves in patterned pillars and digital readout electronics in region 1101, which is integrated per pixel. The thin film 1104 can include one or more of: Aluminum Nitride, Lithium Niobate Lithium Tantalate or other single crystal piezoelectric films to excite sonic waves such as GHz sonic waves in pattern pillars such as Gold/Copper pillars 1105. In some embodiments, the thermal time constant of the 500 µm long, 10 µm radius copper pillar suspended by four silicon (or $SiO_2$, silicon nitride, tantalum, or titanium) beams, each is 10 µm long, 5 um thick and 1 µm wide is 0.33 millisecond. The time constant is reduced by reducing the radius of the Gold or Copper pillar 1105 depending on the ability to pattern a desired aspect ratio. Given that the read-out electronics may be implemented per pixel, then a 20 millisecond or less measurement period may be adequate for even multiple averaging measurements to further reduce the noise and still deliver at least 50 Frames Per Second (FPS) for the full imager.

Figure 13:
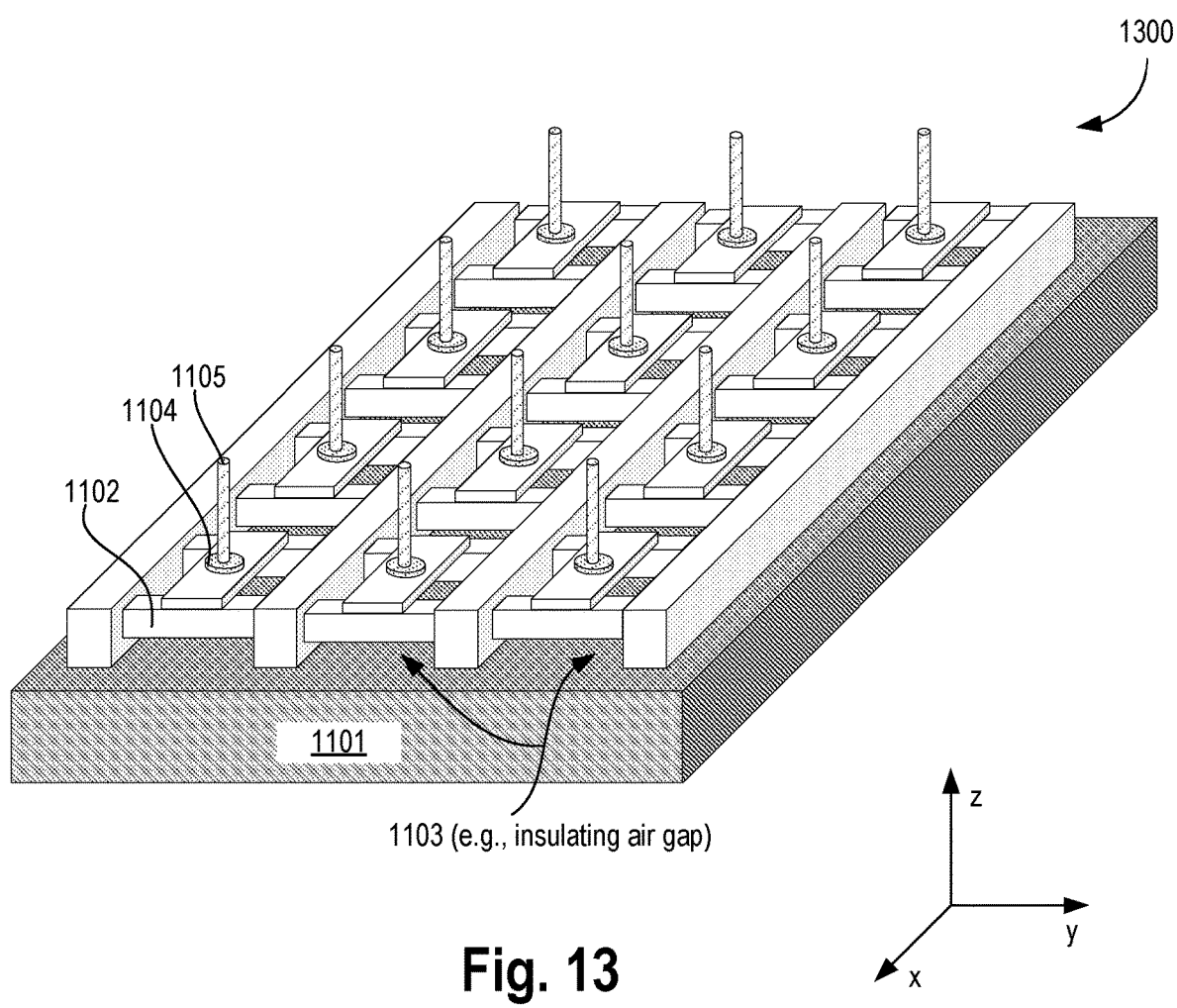
FIG. 13 illustrates a three dimensional (3D) view of an infrared sonic array, in accordance with some embodiments.

FIG. 13 illustrates a three dimensional (3D) view of an infrared sonic array 1300, in accordance with some embodiments. In some embodiments, array 1300 comprises metal pillars 1105 on top of the thin film (such as Aluminum Nitride) piezoelectric transducer 1104 that excites the ultrasonic wave (for example, 1-2 GHz wave) that travels through metal pillar 1105. The ultrasonic pixel is suspended via beams (for example, four beams) 1102 above the silicon substrate where the pixel is isolated from the underlying CMOS ADDLL/ADPLL by an insulating material (e.g., air/vacuum gap) 1103. The suspending beams are designed to have enough thermal isolation between the pixel and substrate 1101. It is possible that each pixel can have its own drive and detection ADPLL/ADPLL in the CMOS area 1101 under the pixel. The per-pixel electronics leads to substantially high frame rate especially when the readout electronics power is optimized (for example to be about 1 milli W).

Compared to state of the art commercial defense grade uncooled infrared bolometers, and based on the data and projections, some embodiments can get to sub 10 µm or less transducer pitch. For example, an array of at least 1000× 1000 elements in 10 mm×10 mm die or smaller with a noise equivalent temperature difference (NEDT) of sub 20 mK or less can be fabricated using the apparatus of various embodiments. This estimated performance may be significant with the key attribute of low cost since in one example, the apparatus or scheme applies mainstream CMOS foundry process with no special materials or complicated processing steps.

Some embodiments utilize the change in speed of sound as a modality to measure the intensity of the energy of incident infrared waves radiated from close or far objects. A sound/ultrasound wave is generated by transducer 1104 that couples the sound wave to acoustic waveguide 1105. Acoustic waveguide 1105 and transducer 1104 form a single pixel in a large array 1300 of these pixels. An image of a scene based on the radiated heat by different objects in the scene can be formed be sensing the change in the speed of sound in each pixel acoustic guide. Objects can be radiating infrared waves with different wavelength and spectrum. The array of pixels can be made of different pixels where a pixel can be a sensitive to a particular wavelength of the incident infrared energy.

In some embodiments, acoustic waveguide 1105 comprises a single material or composite material that absorbs infrared red energy. Acoustic waveguide 1105 can be solid or hollow. Acoustic waveguide 1105 can have circular, rectangular or any uniform or non-uniform polygon cross-section.

In some embodiment, transducer 1104 is an ultrasound transducer. Transducer 1104 takes an electrical signal generated by the pixel electronics in active region 1101 and converts it to ultrasound signal 1106 that couples into acoustic waveguide 1105. Here, incident ultrasound wave 1106 will travel in acoustic wave guide 1105 till it hits its end that is terminated by a high acoustic impedance like air or vacuum and reflected wave 1107 is generated that travels back in acoustic wave guide 1105 towards transducer 1104. When the reflected wave 1107 reaches transducer 1104, it is converted again to an electrical signal. Pixel electronic circuits in active region 1101 converts reflected wave 1107 to a received electrical signal and computes Time-of-Flight (ToF) 1121 between incident pulse 1106 and received pulse 1107. Various embodiment use ToF 1121 of ultrasound waves 1106 and 1107 traveling in a guided structure 1105 as a measure to the incident infrared energy radiated by far or near objects.

In some embodiments, transducer 1104 coupled with acoustic waveguide 1105 is suspended separated from the pixel electronics via an air gap or a thermal isolation material 1103. The pixel is tethered with thin beams 1102, which have appropriate thermal impedance such it that conducts the heat to the thermal mass formed by the carrier wafer to avoid saturation of the pixel but also be a high thermal impedance and prevent heat from flowing from the carrier wader to the pixel. In some embodiments, pixel array 1300 is fabricated using a single wafer where a piezoelectric film is deposited or pattern transferred to the electronics wafer. The isolated air gap is patterned under each pixel. Single metal or stack of metals is patterned to form the horizontal or vertical acoustic waveguides that are coupled to the patterned transducers to either for a single ended or differential sensing pixel.

Figure 14:
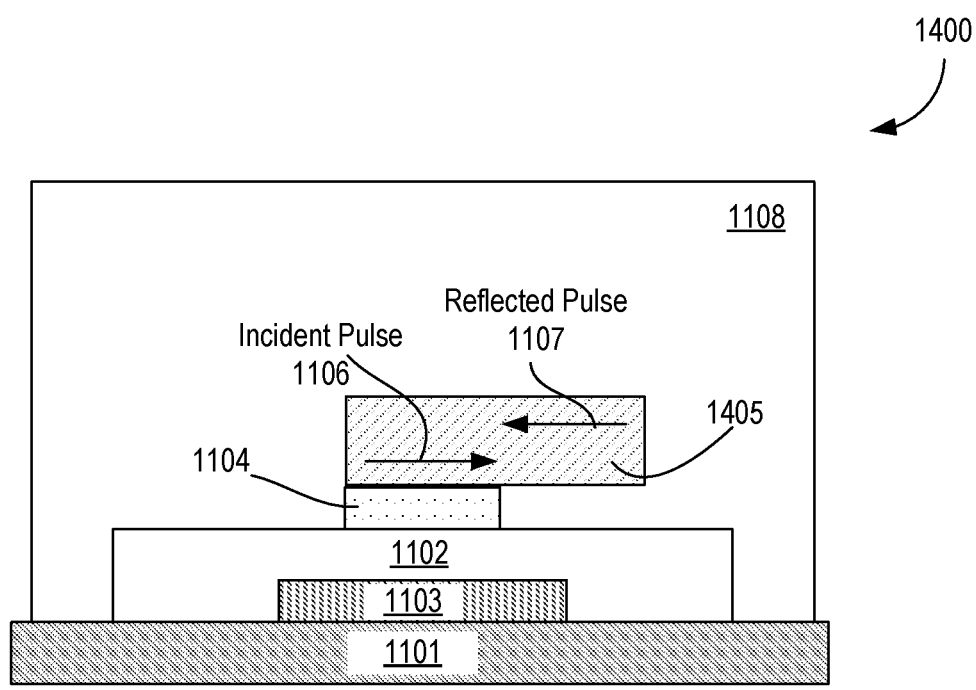
FIG. 14 illustrates a cross-section of a piezoelectric transducer with a horizontal waveguide, in accordance with some embodiments of the disclosure.
Figure 14:
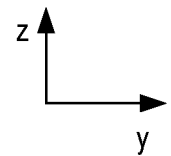

FIG. 14 illustrates a cross-section of a piezoelectric transducer 1400 with a horizontal waveguide 1405, in accordance with some embodiments of the disclosure. The embodiments of the disclosure include horizontal structures and structures operating in multi modes to allow for self-calibration. The embodiments also support different metal alloys that can have high thermal sensitivity and low acoustic velocity that are patterned with very high aspect ratio. Optimization of the read out electronics to achieve sub 1 milli W/pixel or less power envelope is possible for mobile applications where weight and form factor are important. Operation wise, ultrasonic pixel 1100 and 1400 operate the similarly. Here, vertical waveguide 1105 is replaced with a horizontal waveguide 1405.

Figure 15A:
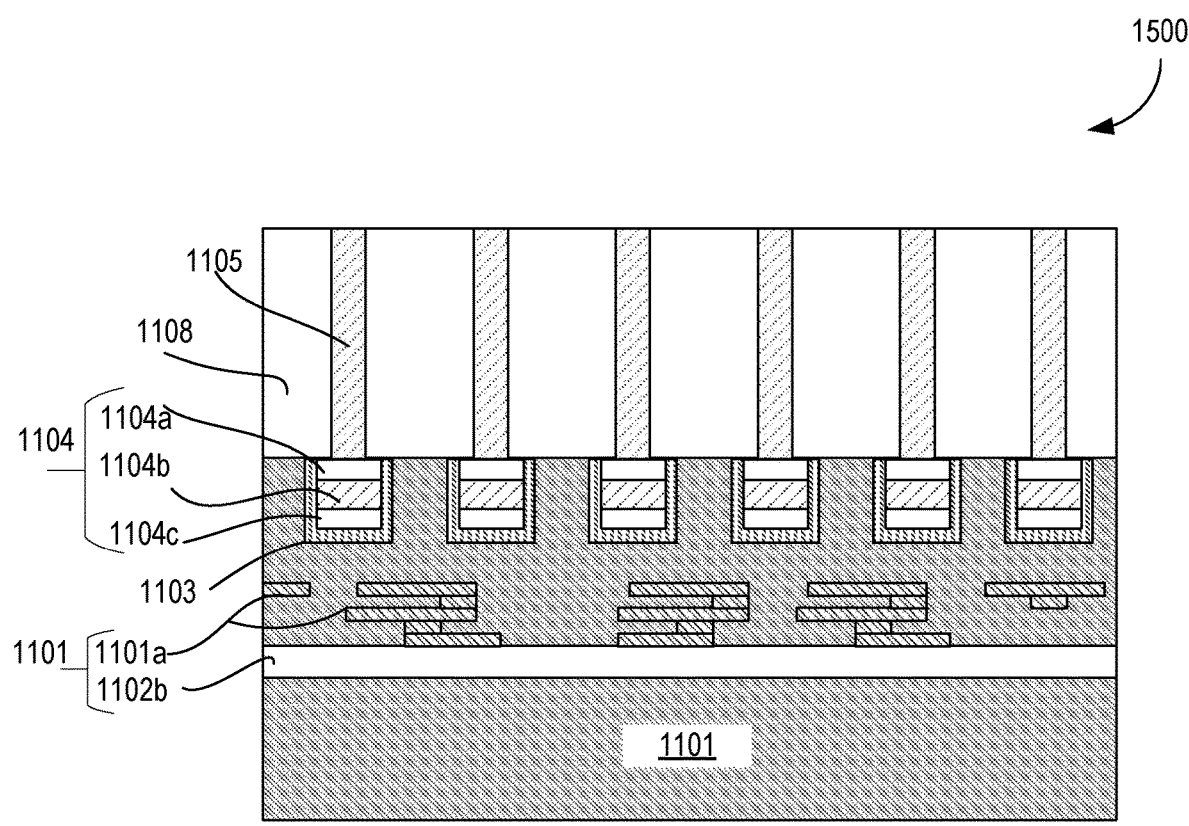
FIG. 15A illustrates a cross-section of vertical acoustic waveguides, in accordance with some embodiments.

FIG. 15A illustrates apparatus 1500 showing a cross-section of vertical acoustic waveguides, in accordance with some embodiments. This is a cross-section of a row or column of ultrasonic pixels of array 1300. While the embodiment here shows vertical waveguides 1105, they can be replaced with horizontal waveguides that can be made of a solid material or composite material. Guided structures 1105 or 1405 can be hollow or solid.

Cross-section in FIG. 15A shows backend metal interconnect layers 1101a and transistor layer 1102b in region 1101. Note, some layers of 1101a can be frontend layers. In some embodiments, transducer 1104 comprises highly absorptive infrared material layer 1104a. This material layer 1104a forms the ultrasonic transducer top electrode. Materials for electrode 1104a includes one of more of: Cu, Al, Au, Ag, W, Co, Ni, or Graphene. In some embodiments, transducer 1104 includes ultrasonic transducer piezoelectric layer 1104b between top electrode 1104a and bottom electrode 1104c. Materials for 1104a and 1104c can be same or different, but have similar functions in that they provide contacts to piezoelectric layer 1104b.

Figure 15B:
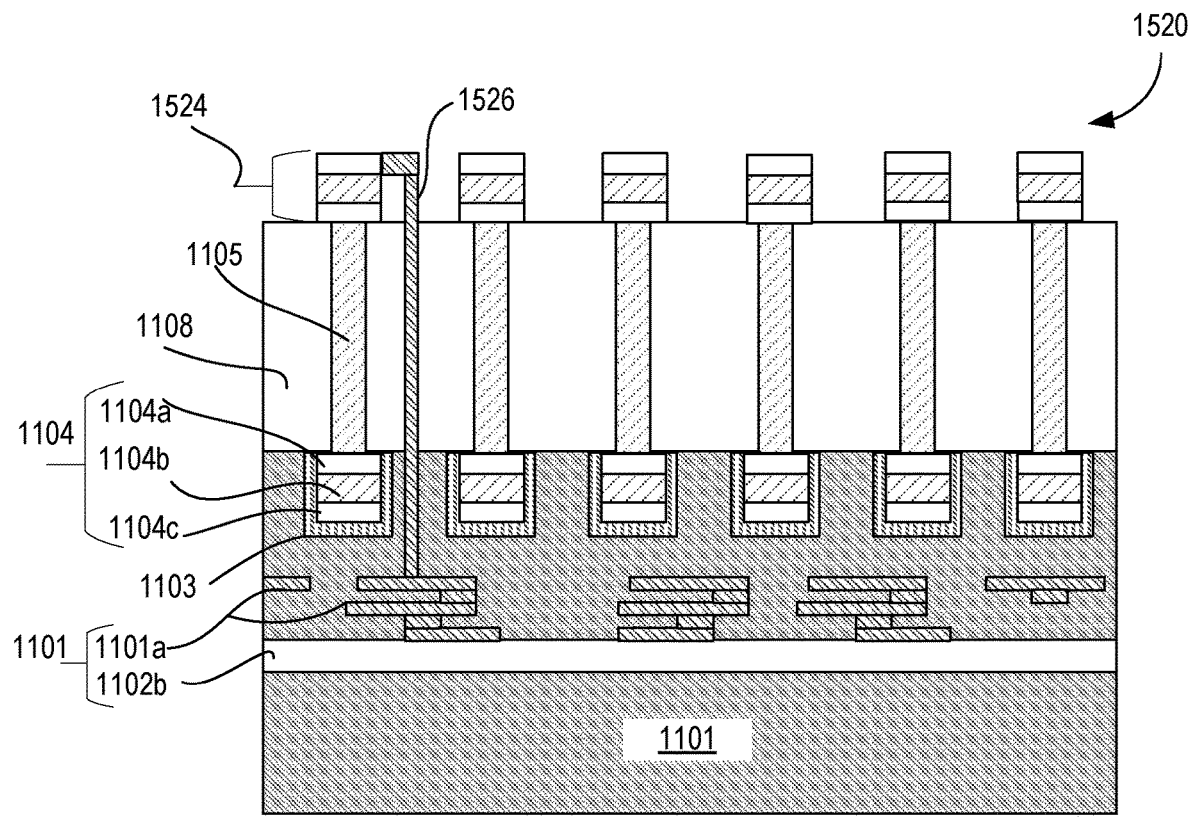
FIG. 15B illustrates a cross-section of vertical acoustic waveguides with dual transducers, in accordance with some embodiments.

FIG. 15B illustrates a cross-section 1520 of vertical acoustic waveguides with dual transducers, in accordance with some embodiments. In some embodiments, a second transducer 1524 (similar to transducer 1104) is coupled to the other end of acoustic waveguide 1105. The second transducer 1524 is coupled to one more active devices via interconnect 1526. One such usage of second transducer 1524 is illustrated with reference to FIG. 15C.

Figure 15C:
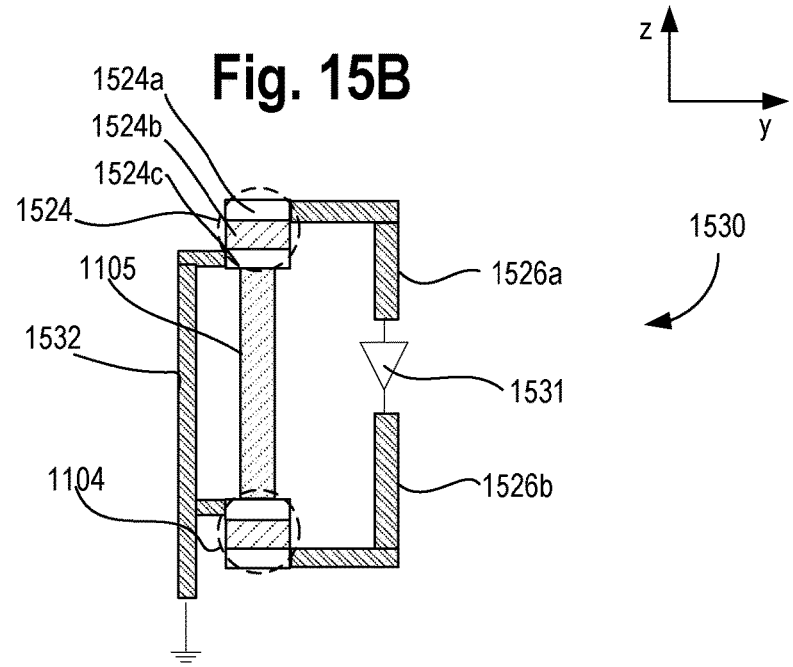
FIG. 15C illustrates a cross-section of vertical acoustic waveguide with dual transducers and an amplifier coupled to the transducers to reduce noise in the system, in accordance with some embodiments.

FIG. 15C illustrates a cross-section 1530 of vertical acoustic waveguide with dual transducers and an amplifier coupled to the transducers to reduce noise in the system, in accordance with some embodiments. Second transducer 1524 includes electrodes 1524a and 1514b, and piezoelectric material 1524b between the electrodes. The configuration of second transducer 1524 is similar to transducer 1104 (first transducer). In some embodiments, electrodes 1524c and 1104a of the two transducers are coupled to ground via interconnect 1532. In some embodiments, an amplifier 1531 is coupled to electrodes 1524a and 1104c of the two transducers. In some embodiments, a pulse is transmitted by one transducer (e.g., 1104) and received by the second transducer (e.g., 1524). In some embodiments, the received pulse is fed to amplifier 1531 and fed again in a loop to the transmitting transducer. The pulse is transmitted a second time in acoustic waveguide 1105. As such, the received pulse from acoustic waveguide 1105 will have double the delay compared to the original triggering pulse. In this matter, an averaging effect is achieved to reduce any noise in the system.

Figure 16A:
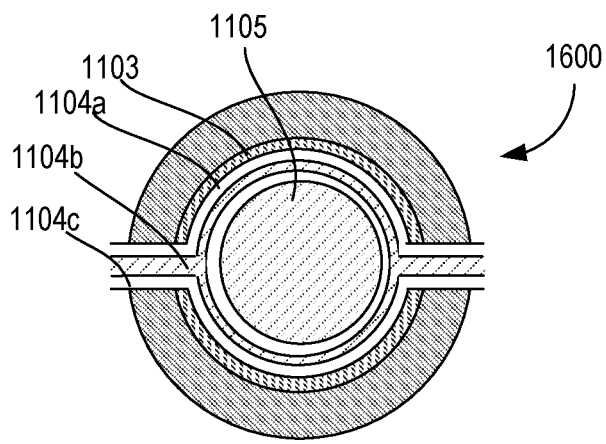
FIGS. 16A-D illustrate cross-sections of vertical acoustic waveguides that are solid (or hollow) of a single material or composite material, in accordance with some embodiments.
Figure 16B:
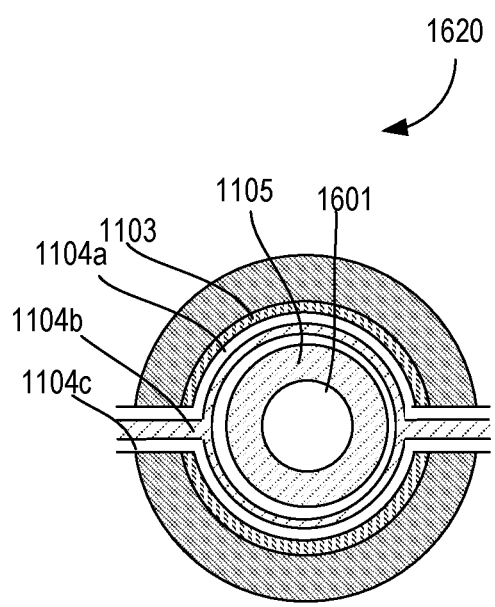
Figure 16C:
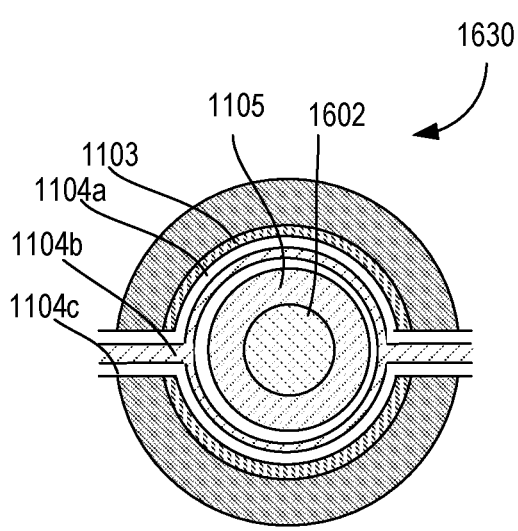
Figure 16D:
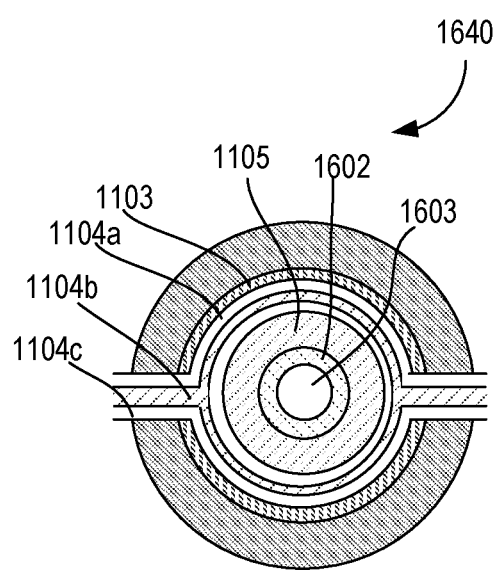

FIGS. 16A-B illustrates cross-sections 1600, 1620, 1630, and 1640, respectively, of vertical acoustic waveguides that are solid (or hollow) of a single material or composite material, in accordance with some embodiments. Cross-section 1600 shows that the waveguide is a solid single material. Cross-section 1620 shows hole 1601 inside waveguide 1105. Cross-section 1630 shows a composite waveguide where hole 1601 is filled with material 1602 waveguide 1105. Cross-section 1640 shows another type of composite waveguide where a hole 1603 is formed inside material 1602.

Figure 17:
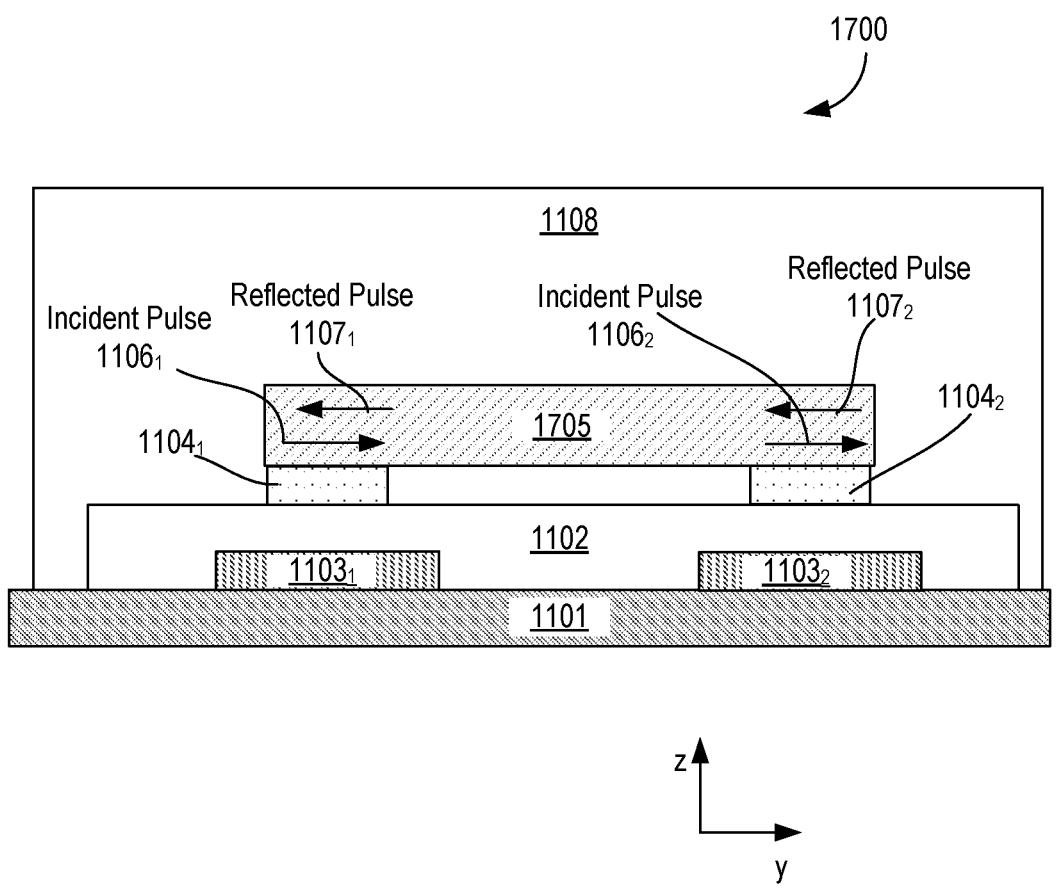
FIG. 17 illustrates a cross-section of two ultrasound transducers coupled via a horizontal waveguide, in accordance with some embodiments.

FIG. 17 illustrates cross-section 1700 of two ultrasound transducers 1104$_1$ and 1104$_2$ coupled via a horizontal waveguide 1705, in accordance with some embodiments. Structure 1102 covers the two insulating regions 1103$_1$ and 1103$_2$ under each transducer. In this embodiment, waveguide 1705 is over transducers 1104$_1$ and 1104$_2$. In some embodiments, transducer 1104$_1$ can excite and couple different modes of the acoustic wave in the horizontal waveguide 1705. Further one transducer (e.g., 1104$_1$) at one end can excite one mode (e.g., send out incident wave 1106$_1$) while the transducer (e.g., 1104$_1$) at the other end will excite a different mode at a different frequency and pulse shape (e.g., send out incident wave 1106$_2$) that also couples to waveguide 1705. Each incident wave of a mode results in a corresponding reflected pulse for that mode at that frequency and pulse shape.

For example, incident wave 1106$_1$ from transducer 1104$_1$ results in reflected pulse 1107$_2$, while incident wave 1106$_2$ from transducer 1104$_2$ results in reflected pulse 1107$_1$. These different modes can have different speeds and thermal sensitivities and hence are used for differential sensing and self-calibration per pixel. In another embodiment, the transducer 1104$_1$ is configured in different methods to couple the energy to another acoustic waveguide. For example, two or more acoustic waveguides are coupled to the same transducer.

Figure 18:
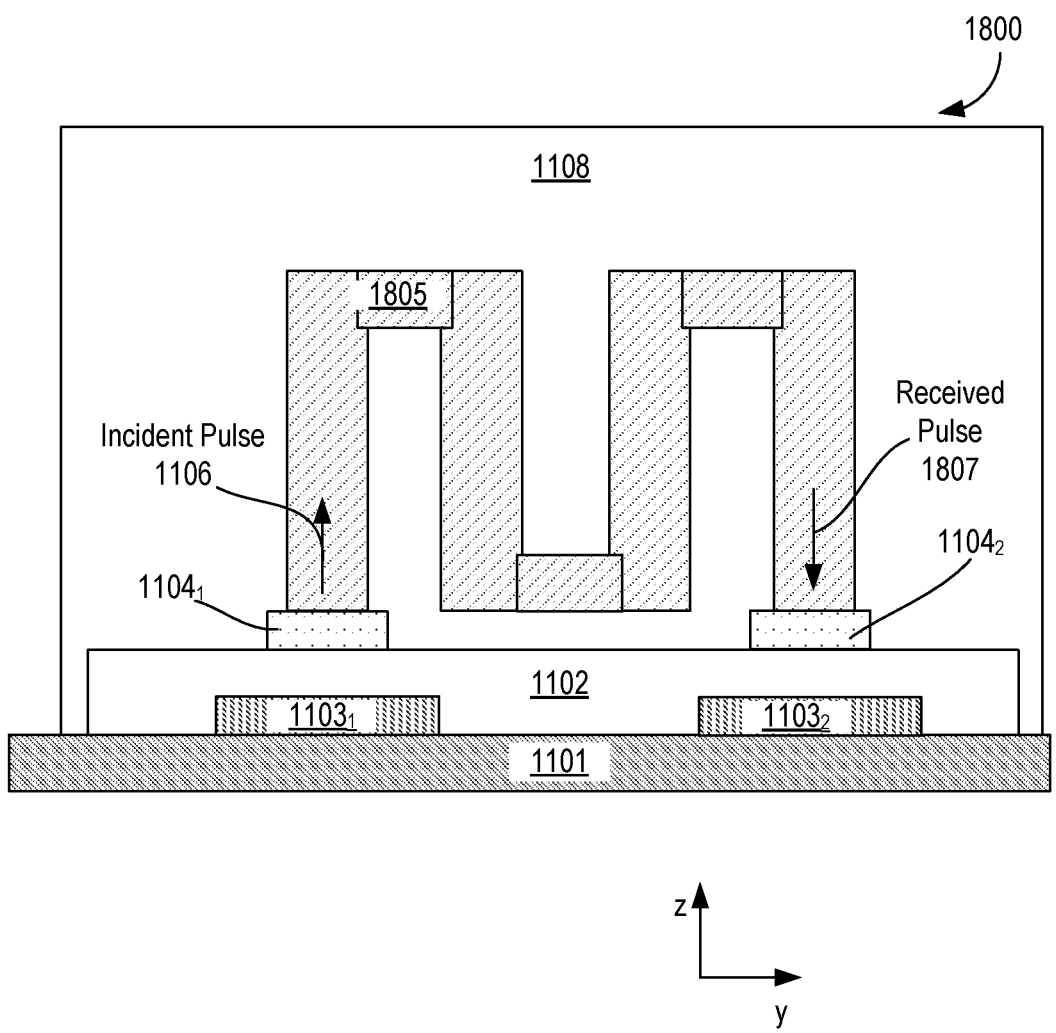
FIG. 18 illustrates a cross-section of two ultrasound transducers coupled via a vertical meander waveguide, in accordance with some embodiments.

FIG. 18 illustrates cross-section 1800 of two ultrasound transducers coupled via a vertical meander waveguide 1805 with horizontal stubs, in accordance with some embodiments. In this case, the ToF may be longer because of the effective length of waveguide 1805.

Figure 19:
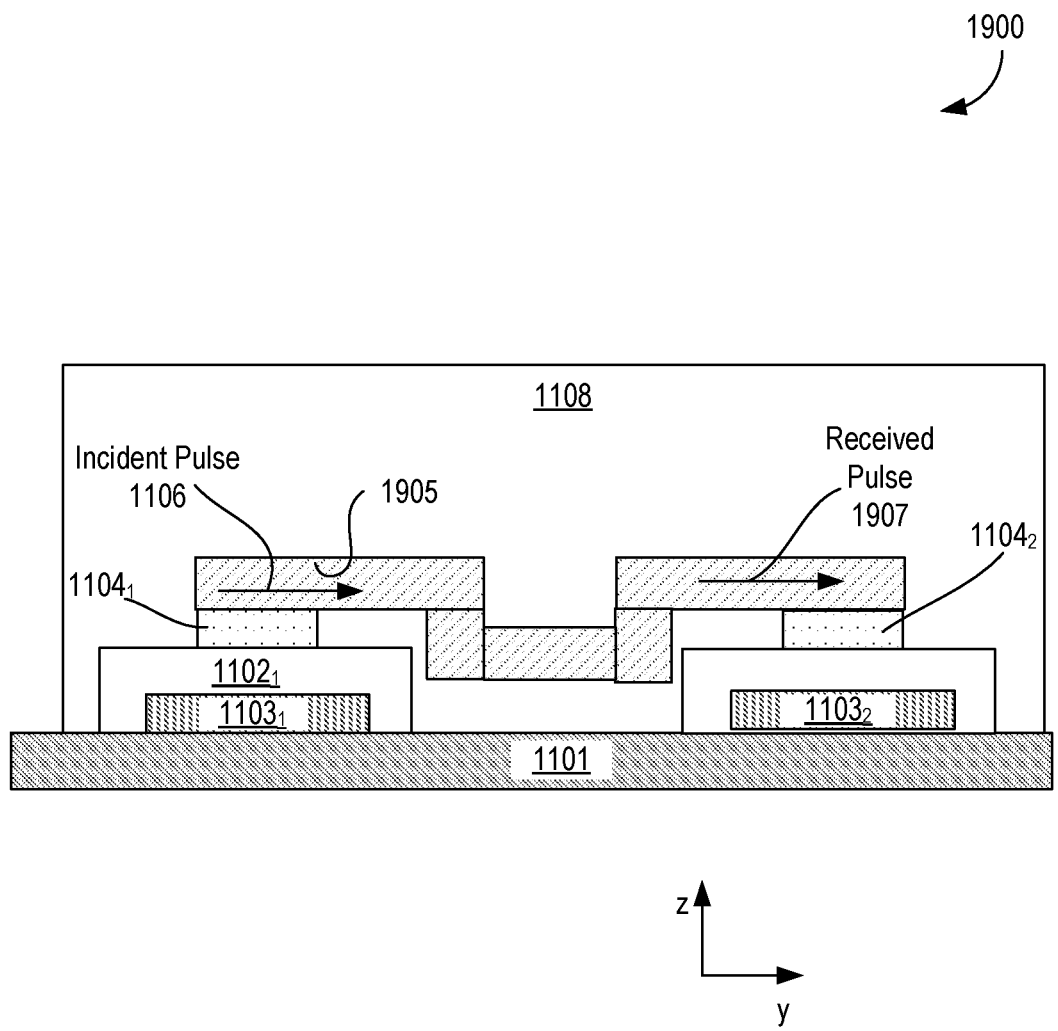
FIG. 19 illustrates a cross-section of two ultrasound transducers coupled via a horizontal meander waveguide, where the transducer is under the acoustic guide, in accordance with some embodiments.

FIG. 19 illustrates cross-section 1900 of two ultrasound transducers coupled via a horizontal meander waveguide 1905, where the transducer is under the acoustic guide, in accordance with some embodiments. Incident wave 1106 travels through horizontal meander waveguide 1905 and is received by transducer 1104₂ as received pulse 1907.

Figure 20:
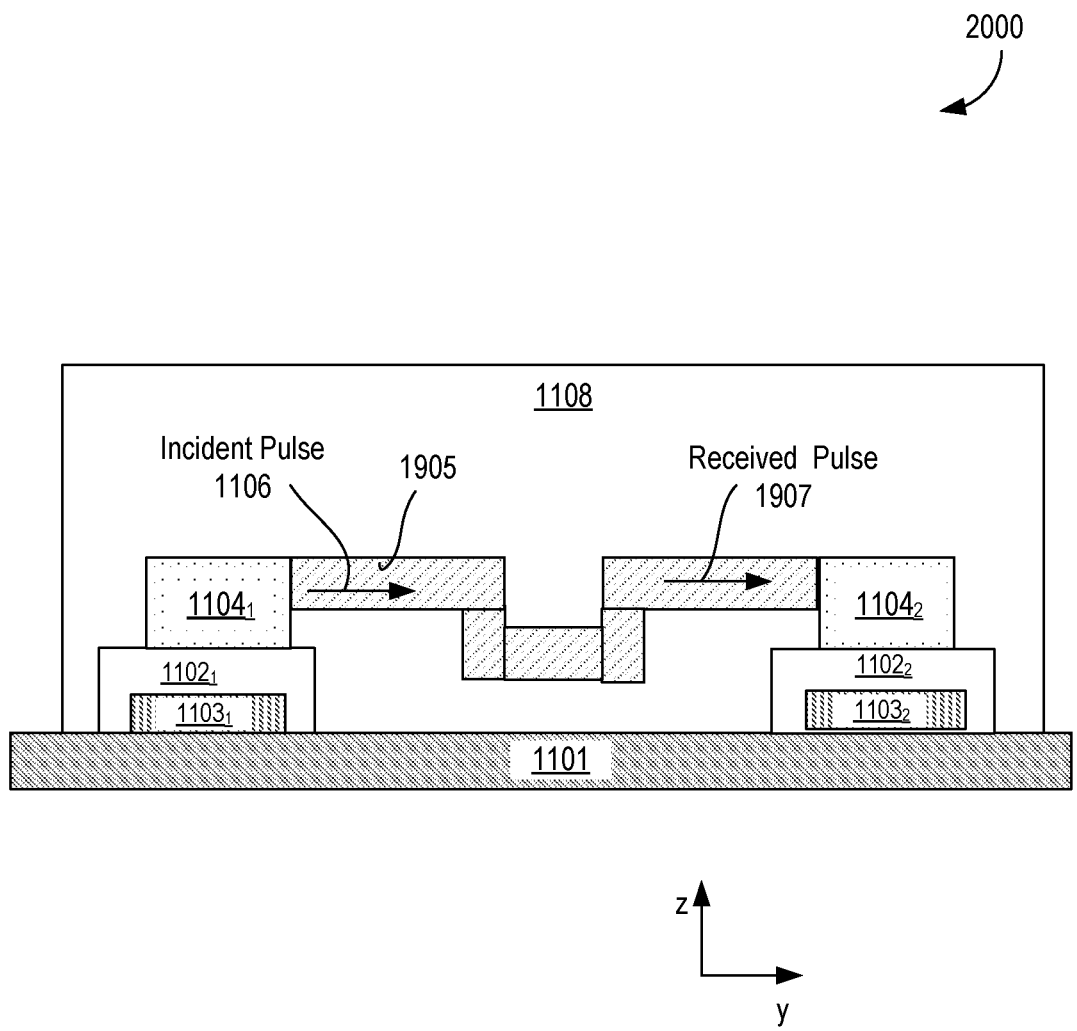
FIG. 20 illustrates a cross-section of two ultrasound transducers where the acoustic guide couples to the transducers from their respective sides, in accordance with some embodiments.

FIG. 20 illustrates cross-section 2000 of two ultrasound transducers where the acoustic guide couples to the transducers from their respective sides, in accordance with some embodiments. Compared to cross-section 1900, the horizontal waveguide is not on top of the transducer but adjacent to the side along the z-axis. In some embodiments, vertical acoustic guide 1105 configurations is fabricated using different wafer processing approaches. For example, a through silicon via (TSV) process is used to form waveguide 1105.

In some embodiments, digital Delay locked Loops or Phase locked loops are used to resolve the time of flight of the ultrasound wave 1907 in acoustic waveguide 1905 to measure the absolute and change in temperature of 1905 due to the absorbed infrared energy. In some embodiments, ultrasonic transducer 1104₂ operating in GHz frequency range can operate at lower frequencies and can be made of different materials like Zinc Oxide, Lithium Niobate, Aluminum Nitride, PZT, Gallium Nitride, PVDF or other piezoelectric materials.

Figure 21:
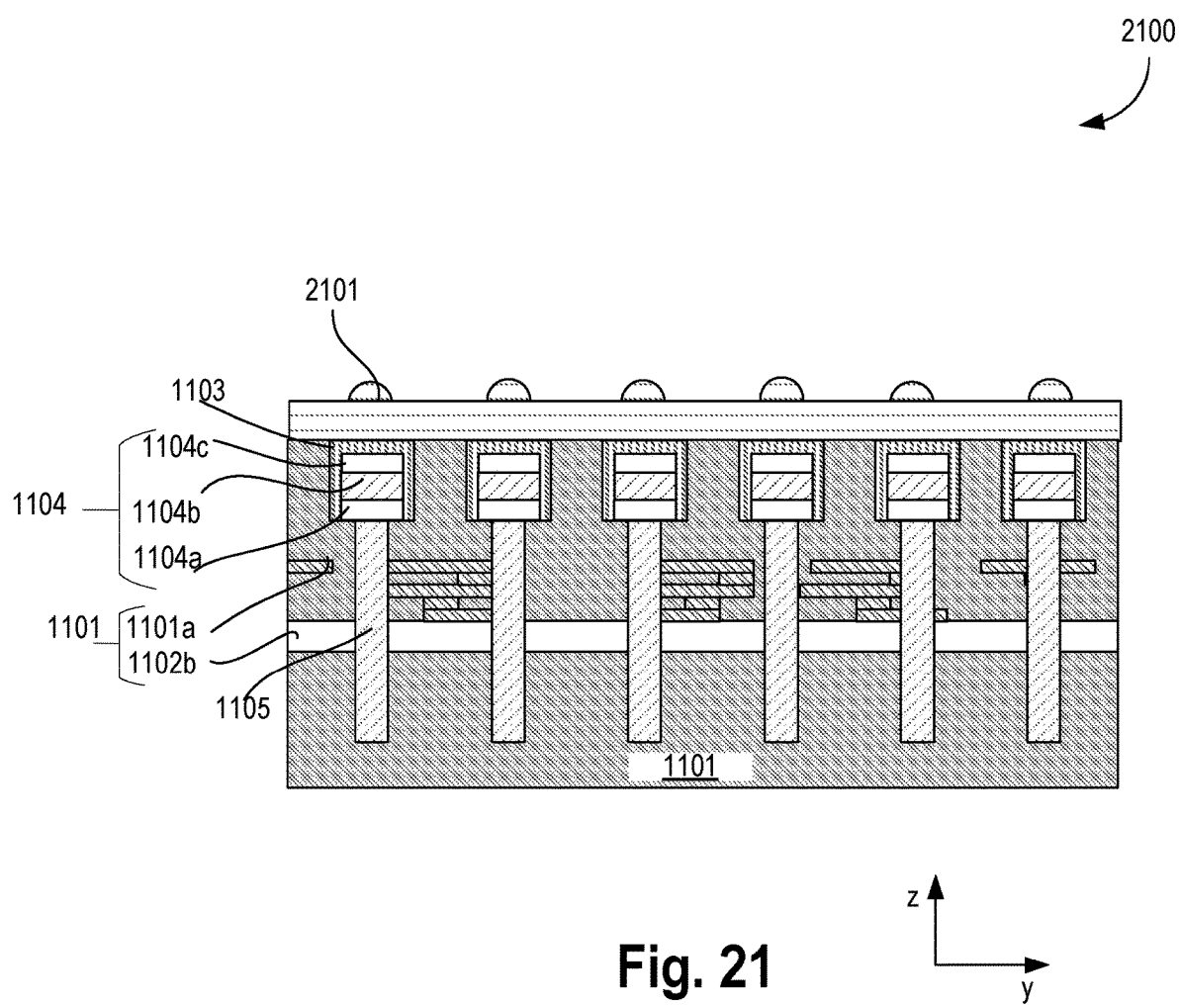
FIG. 21 illustrates a cross-section of part of an ultrasound transducer apparatus using a through silicon via (TSV) process to form the waveguide, in accordance with some embodiments.
Figure 22A:
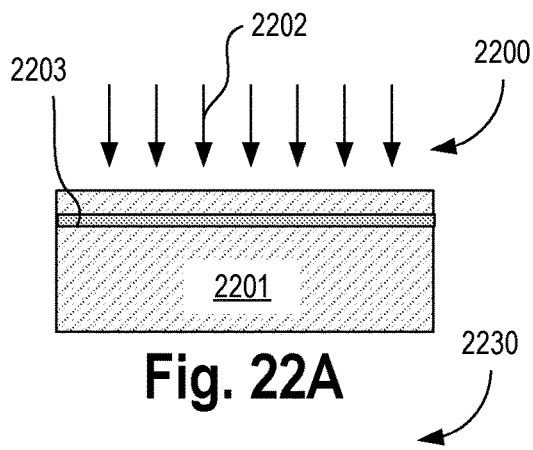
FIGS. 22A-H illustrate a process flow used to form the ultrasound transducer apparatus, in accordance with some embodiments.
Figure 22B:
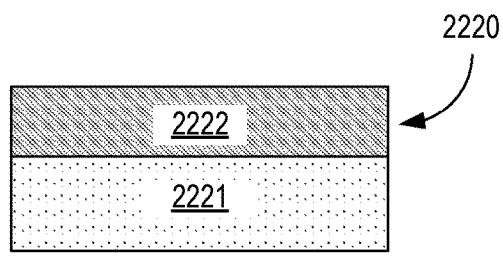
Figure 22C:
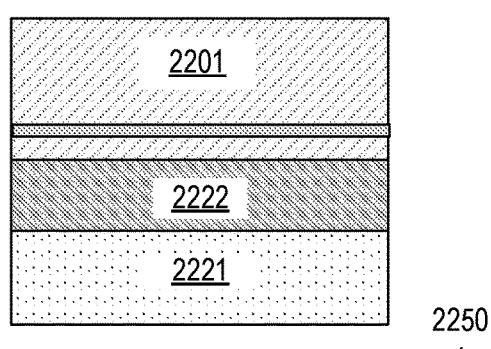
Figure 22D:
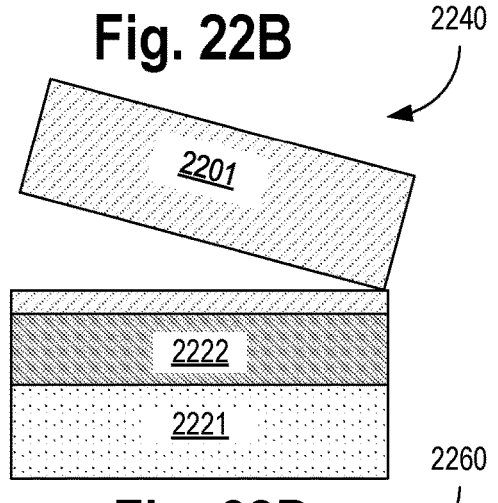
Figure 22E:
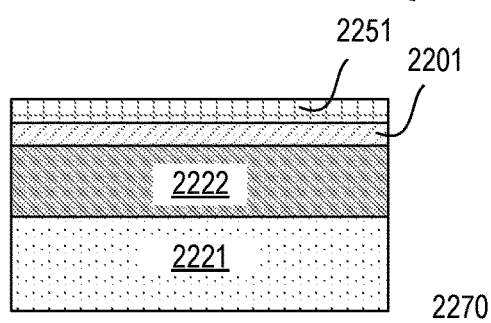
Figure 22F:
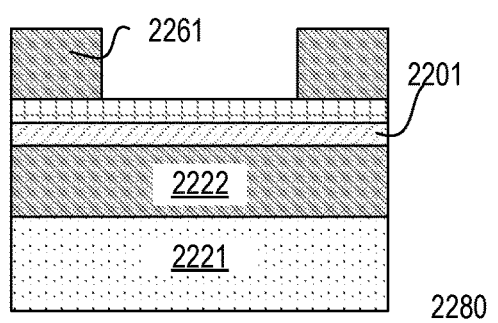
Figure 22G:
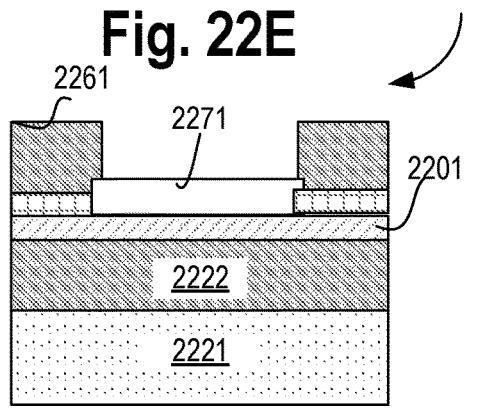
Figure 22H:
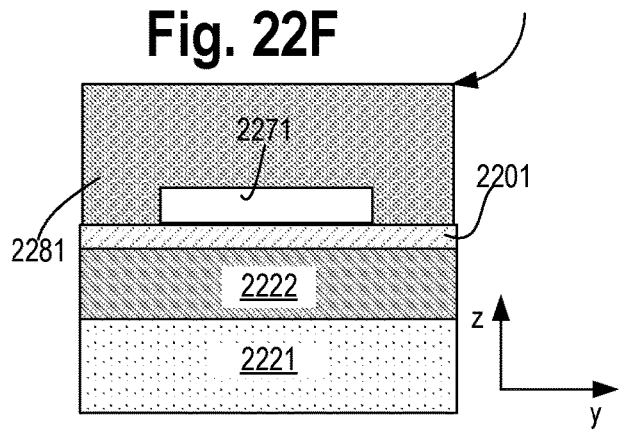

FIG. 21 illustrates cross-section 2100 of part of an ultrasound transducer apparatus using a through silicon via (TSV) process to form the waveguide, in accordance with some embodiments. In this example, bumps 2101 couple the transducers for each waveguide. Bumps 2101 can be then connect to another die having active or passive devices.

In another example, a through glass via (TGV) process is used. In this process, a piezoelectric film is deposited or pattern transferred to a glass wafer. Metal electrodes are patterned on the glass wafers to form the electrodes for the transducer. A separate CMOS wafer with the pixel electronics is patterned to form the isolation air gap and the access tethers to the transducer, in accordance with some embodiments.

FIGS. 22A-H illustrate a process flow comprising processes 2200, 2220, 2230, 2240, 2250, 2260, 2270, and 2280, respectively, used to form the ultrasound transducer apparatus, in accordance with some embodiments. In process 2200, ion implantation is done on a LiNbO3 wafer 2201. Ions 2202 are implanted to the LiNbO3 waver. Region 2202 is shown as the tear-off region. Part of LiNbO3 waver is split across the region 2203 later. Region 2303 is also the implant region, where most of the ions (e.g., He+ ions) reside, in accordance with some embodiments. In process 2220, SiO2 2222 is deposited on a Si substrate 2221. In process 2230, wafer bonding is performed where LiNbO3 2201 is bonded to the composite structure of Si 2221 and SiO2 2222. In process 2240, part of LiNbO3 wafer is split along the region 2202. In this example, the thickness of LiNbO3 left attached to SiO2 2222 is about 400 nm while the thickness of SiO2 along the z direction is about 2000 nm. In process 2250, tantalum Ta 2251 is deposited over LiNbO3 2201. In process 2260, SiO2 mask with e-beam lithography is performed to deposit SiO2 2261. In process 2270, Ta2O5 2271 is grown or deposited between SiO2 stubs 2261 after portion of Ta 2251 between SiO2 2261 is etched out. In some embodiments, this process is performed by SiO2 mask with e-beam lithography. In process 2280, SiO2 2261 and Ta 2251 below it is also etched. The region above Ta2O5 2271 is filled with SiO2 2281. This Ta2O5 (i.e., the selective oxidation of Ta) forms the submicron LiNbO3 ridge waveguide on silicon. In this example, the width of Ta2O3 along the y-axis is around 900 nm.

Some embodiments use sputtering of doped or un-doped films like scandium doped aluminum nitride, some embodiments use amorphous growth and some use layer transfer, as shown in FIGS. 22A-H.

FIGS. 23A-G illustrate a process flow having processes 2300, 2320, 2320, 2340, 2350, 2360, and 2370, respectively, used to form the ultrasound transducer apparatus, in accordance with some embodiments. At process 2300, He+ ions 2301 are implanted on the surface of LiNbO3 wafer 2201. At process 2320, surface of He+ implanted LiNbO3 wafer is prepared, where region 2302 is the implant region. At process 2330, He+ implanted LiNbO3 wafer from process 2330 is bonded onto BCB (Benzocyclobutene) 2303. BCB-based polymer dielectrics 2303 may be spun on or applied to LiNbO3 (or other substrates) for use in Micro Electro-Mechanical Systems (MEMS) and microelectronics processing. At process 2340, surface of LiNbO3 along the implant region is split. For example, surface of LiNbO3 along the implant region 2302 is split in a furnace. At process 2350, metal electrodes 2304 are defined. These electrodes can have any suitable metal such as Al, Cu, W, Co, Graphene. At process 2360, release windows 2305 are defined. For example, an etching process is performed to make regions 2305. At process 2370, wet etch and CPD (critical point drying) release is performed to pick up the electrodes on LiNbO3. These electrodes 2304 form the ultrasonic waveguides, in accordance with some embodiments.

Figure 24:
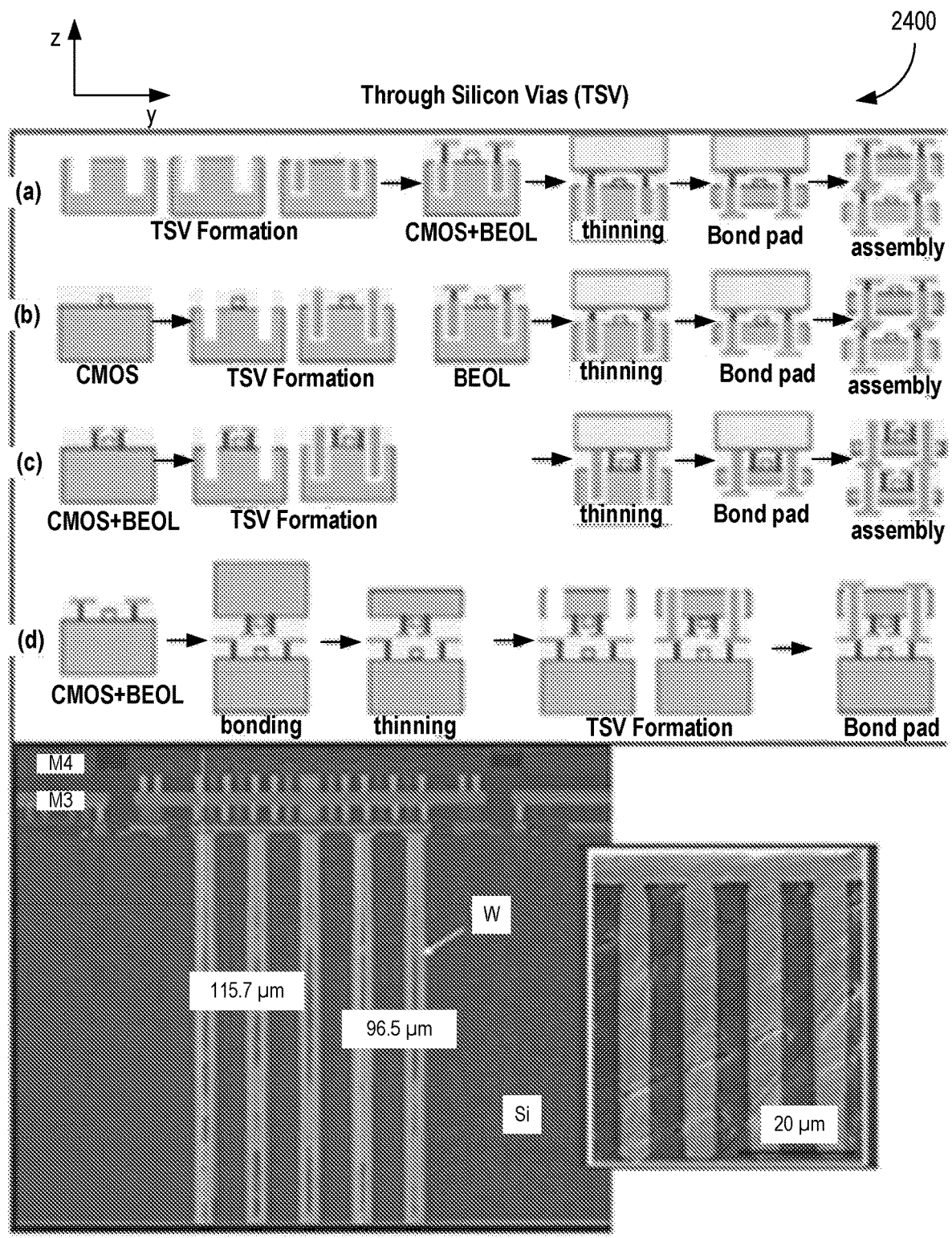
FIG. 24 illustrates a process flow for making an acoustic guide using Through Silicon Vias (TSVs), in accordance with some embodiments.
Figure 25:
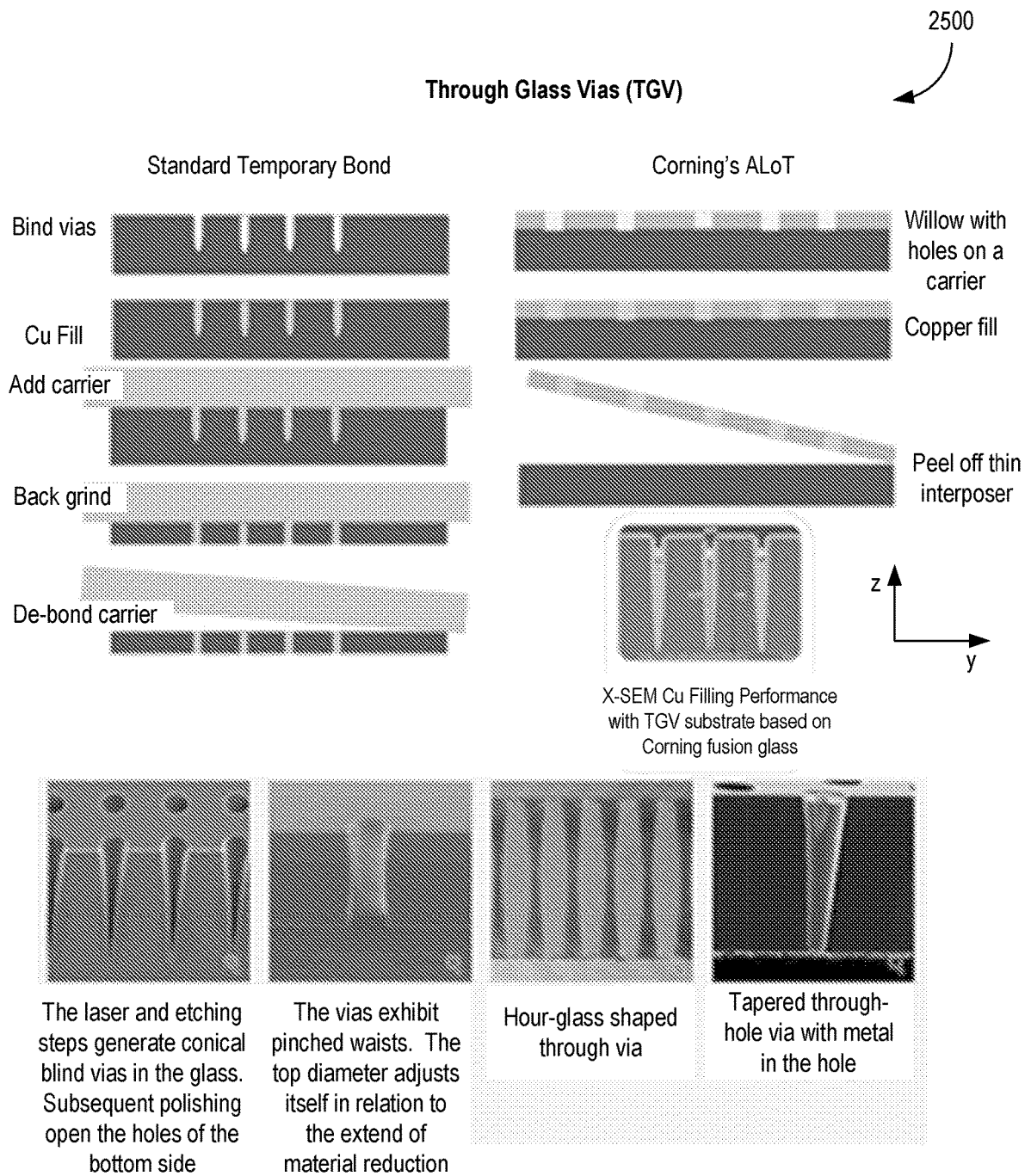
FIG. 25 illustrates a process flow for making an acoustic guide using Through Glass Vias (TGVs), in accordance with some embodiments of the disclosure.

FIG. 24 illustrates process flow 2400 for making an acoustic guide using Through Silicon Vias (TSVs), in accordance with some embodiments. FIG. 25 illustrates a process flow 2500 for making an acoustic guide using Through Glass Vias (TGVs), in accordance with some embodiments of the disclosure.

Figure 26:
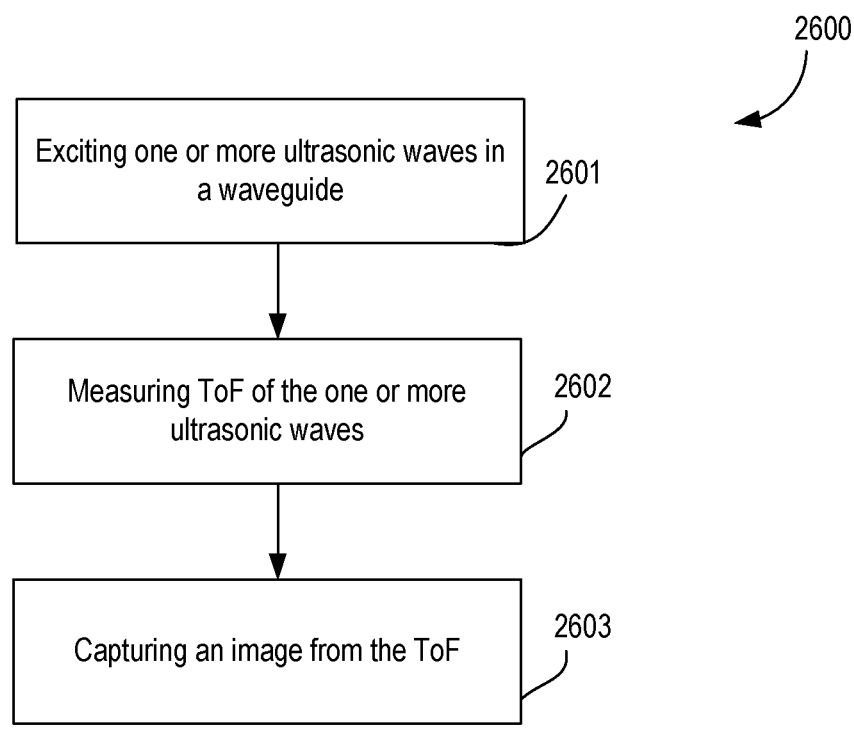
FIG. 26 illustrates a flowchart showing method of performing the apparatus to capture an image of an object from its infrared radiation, in accordance with some embodiments.

FIG. 26 illustrates flowchart 2600 showing method of performing the apparatus to capture an image of an object from its infrared radiation, in accordance with some embodiments. At block 2601, the method comprises exciting one or more ultrasonic waves in a waveguide. The waveguide may one formed of one or more of: metal including one or more of copper, gold, graphene, or tungsten; dielectrics including HfO, GaN; high-k dielectrics; material that has high infrared absorption coefficient; or material with high thermal conductivity and a Young's modulus that is sensitive to temperature change.

At block 2602, a Time of Flight (ToF) is measured of the one or more ultrasonic waves in the waveguide, wherein the ToF is a function of an incident infrared light energy on the waveguide. For example, the ToF is measured by using one of: a delayed locked loop; or a phased locked loop. In some embodiments, exciting the ultrasonic waves in the waveguide comprises: generating the one or more ultrasonic waves by a piezoelectric transducer 1104 into the waveguide 1105, wherein the piezoelectric transducer is coupled with the waveguide. In some embodiments, measuring the Time of Flight (ToF) of the one or more ultrasonic wave in the waveguide further comprises: measuring a total time between the generation of the one or more ultrasonic waves and a generation of an electrical output by the piezoelectric transducer upon detecting a reflected ultrasonic pulse which traveled within the waveguide. In some embodiments, the waveguide is perpendicular to an x-y plane, and wherein the piezoelectric transducer in along the x-y plane. In some embodiments, the waveguide is parallel to the piezoelectric transducer.

In some embodiments, transducer 1104 can excite single or multiple acoustic modes in the waveguide. Such modes can be bulk modes or surface modes or compound modes. These modes can operate at different frequencies and exhibit different thermal sensitivities. Some embodiments utilize these different thermal sensitivities to perform self-calibration of the absolute and relative change in temperature of the waveguide as measured by the change in the speed of sound/ToF. The self-calibration is used to further reduce noise and enhance sensitivity. In some embodiments, acoustic waveguide 1105 is fabricated from a single material like gold, copper, silver, titanium, hafnium oxide or a compound material using different fabrication flows in different wafers. Fabrication is done using a Through Silicon/Silicon Germanium/Silicon Carbide/Gallium Nitride Vias process or using a Through Glass Vias process as shown in FIGS. 24-25 with different shapes for the acoustic guide like conical or tapered structures.

In some embodiments, the compact size and high performance infrared sensors would enable new applications. For example, biometric imaging like touchless fingerprint sensing both for latent and touch fingers is achieved. The imaging is done passively or using an assisted IR source to brighten the scene. The apparatus and techniques of some embodiments are used for insitu imaging of human airways for guided or autonomous intubation of airways in humans and animals.

Elements of some embodiments are also provided as a machine-readable medium for storing the computer-executable instructions (e.g., instructions to implement any other processes discussed herein including flowchart 2600). The machine-readable medium may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Figure 27:
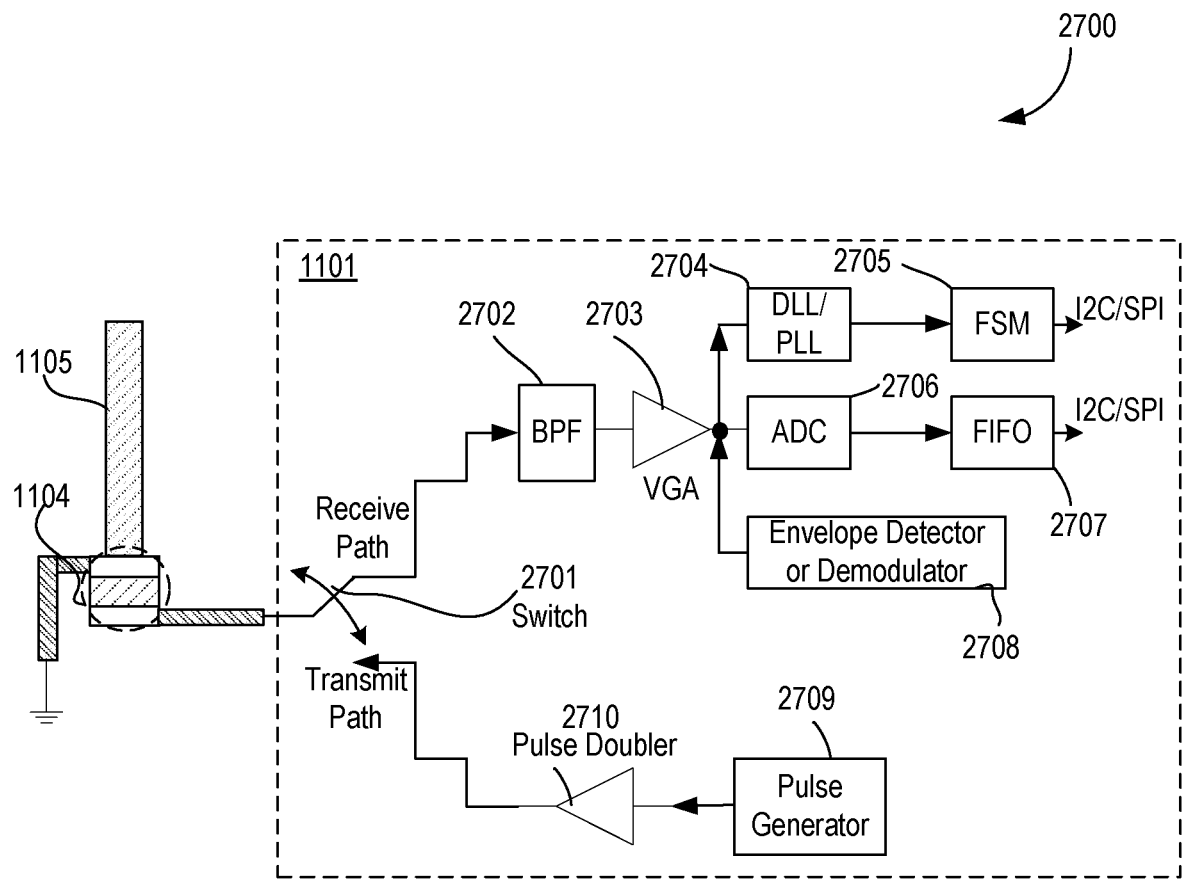
FIG. 27 illustrates an architecture for infrared signal detection and processing, in accordance with some embodiments.

FIG. 27 illustrates architecture 2700 for infrared signal detection and processing, in accordance with some embodiments. Architecture 2700 illustrates a pixel comprising acoustic waveguide 1105 and transducer 1104 communicatively coupled switch 2701 and other active device in region 1101. In some embodiments, switch 2701 is controllable by logic (not shown) to generate incident signal 1106 in 1105 using the transmit path, or receive reflected signal 1107 and provide it to the receive path.

In some embodiments, receive path is coupled to band-pass filter (BPF) 2702. In one example, BPF 2702 may have a bandwidth of 300 MHz and initial filtering frequency f0 at 1 GHz. Other parameters for BPF 2702 may also be used. In some embodiments, the output of BPF 2702 is coupled to voltage gain amplifier (VGA) 2703. In one example, VGA 2703 has a gain of substantially 52 dB. In some embodiments, VGA comprises circuitry 600 and 700. In some embodiments, the output of VGA 2703 is received by DLL/PLL 2704 (e.g., PLL 1200). In some embodiments, DLL/PLL 2704 is used to compute the ToF. For example, DLL/PLL 2704 is used to determine the start of incident signal 1106 and the time it takes for reflected signal 1107 to arrive back. Finite state machine (FSM) 2705 then computes the ToF from these times measured by DLL/PLL. A digital signal processor receives the output of FSM 2705 to capture the image of the object radiating infrared signals. FSM 2705 can also convert ToF to temperature. In some embodiments, the output of FSM 2705 is provided over I2C. Other interfaces for communicating with FSM 2705 include SPI (serial peripheral interface), UART (universal asynchronous receiver/transmitter), USB (universal serial bus), etc.

In some embodiments, output of VGA 2703 is received by analog-to-digital converter (ADC) 2706. ADCs are apparatuses that convert continuous physical quantities (e.g., voltages) to digital numbers that represent the amplitude of the physical quantities. In some embodiments, ADC 2706 converts the analog output of VGA 2703 to its corresponding digital representations. Any suitable ADC may be used to implement ADC 2706. For example, ADC 2706 is one of: direct-conversion ADC (for flash ADC), two-step flash ADC, successive-approximation ADC (SAR ADC), ramp-compare ADC, Wilkinson ADC, integrating ADC, delta-encoded ADC or counter-ramp, pipeline ADC (also called subranging quantizer), sigma-delta ADC (also known as a delta-sigma ADC), time-interleaved ADC, ADC with intermediate FM stage, or time-stretch ADC. In one example, ADC 2706 is a 12 bit ADC that can differentiate an analog signals by 100 micro volt (e.g., least significant bit LSB is 100 micro-volts).

The output of ADC 2706 is then received by a series of registers such as a first-in-first-out (FIFO) pipeline 2707. In some embodiments, a digital signal processor receives the output of FIFO pipeline 2707 to capture the image of the object radiating infrared signals. In some embodiments, the output of FIFO pipeline 2707 is provided over I2C. Other interfaces for communicating with FSM 2705 include SPI (serial peripheral interface), UART (universal asynchronous receiver/transmitter), USB (universal serial bus), etc.

In some embodiments, an envelope detector or demodulator 2708 is used. In some embodiments, envelope detector 2708 generates an ensemble of reflected pulses where the peak of the ensemble is accurately detected after digitizing. As such, the time of the peak of the envelope accurately represents the first arrival/reflection ToF. In some embodiments, sophisticated digital processing can be applied to further increase the accuracy of measuring the time of flight and hence the sensitivity of to the absorbed infrared.

In some embodiments, the transmit path when enabled provides the control signals for the transducer 1104 to generate the incident signal 1106. In some embodiments, the transmit path comprises pulse generator 2709 coupled to a pulse doubler 2710. In some embodiments, pulse generator 2709 is a programmable pulse generator that can generate a single pulse or multiple pulses with varying pulse widths (e.g., pulse widths of 250 pS to 625 pS). The multiple pulses may be repeated periodically (e.g., every 20 mS). In some embodiments, the pulses are modulated as PWM (pulse width modulation) signals. In some embodiments, pulse doubler 2710 amplifies the pulse widths for transducer 1104.

Figure 28:
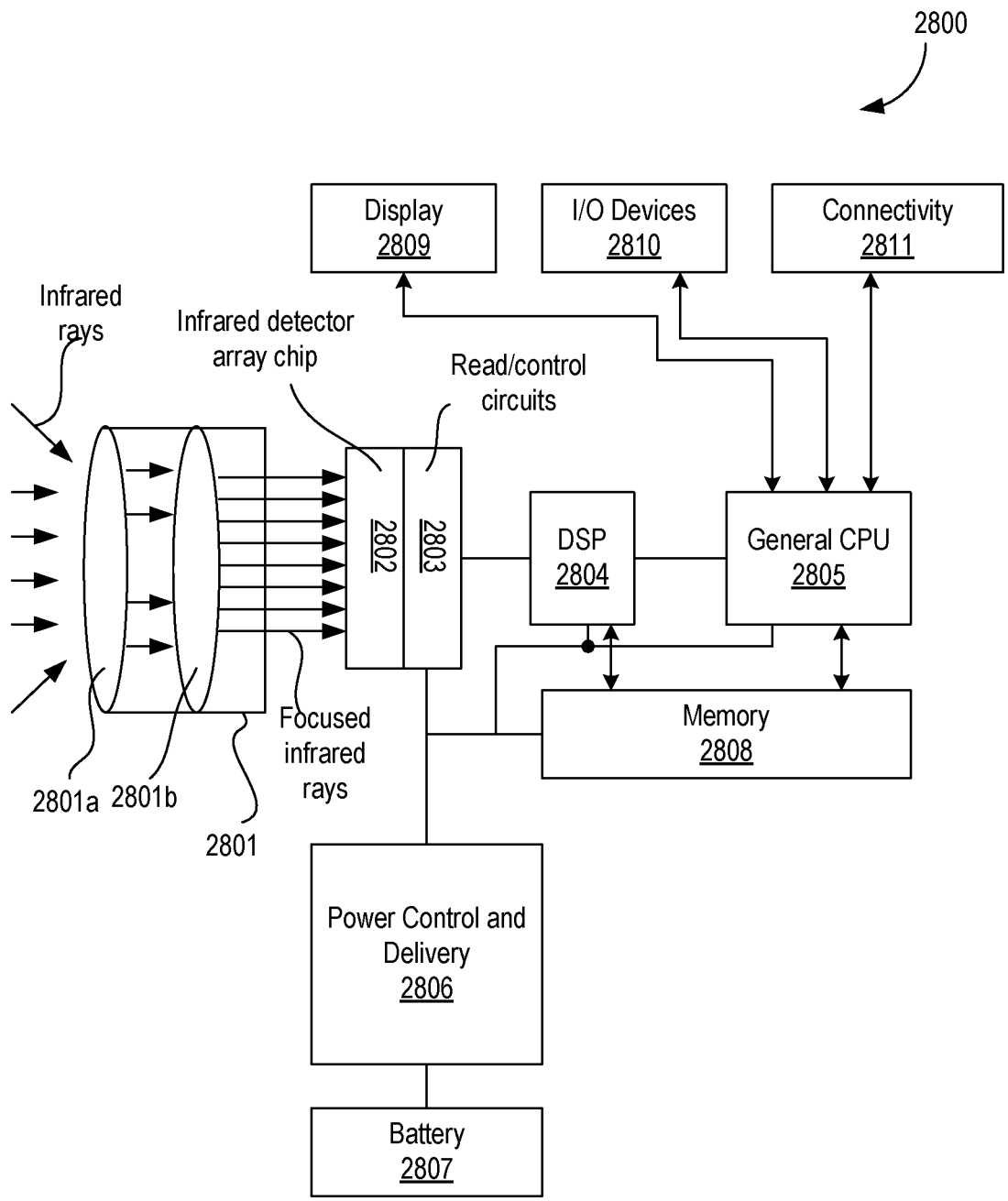
FIG. 28 illustrates a system or system-on-chip for infrared signal detection and processing, in accordance with some embodiments.

FIG. 28 illustrates a system or system-on-chip 2800 for infrared signal detection and processing, in accordance with some embodiments.

In some embodiments, system 2800 comprises lens assembly 2801, infrared detector array 2802, read and/or control circuits 2803, digital signal processor 2804, general processor or CPU (central processing unit) 2805, power control and delivery circuitry 2806, battery 2807, display 2809, input devices 2810, and connectivity 2811. The various features of system 2800 can be integrated in a single system-on-chip (SOC) or separate chips.

In some embodiments, lens assembly 2801 comprises one or more lens 2801*a/b* to receive infrared radiation from one or more objects and focuses the infrared radiation towards infrared detector array 2802. In some embodiments, lens 2801*a/b* have programmable focal length. Any suitable material can be used for manufacturing lenses 2801*a/b*.

In some embodiments, infrared detector array 2802 comprises an array of acoustic pillars (horizontal, vertical etc.) and associated transducers as discussed with reference to various embodiments such as array 1300. In some embodiments, read/control circuits 2803 are active devices in active region 1101 and communicatively coupled to infrared detector array 2802. In some embodiments, read/control circuits 2803 comprise circuitry described with reference to FIG. 27.

Referring back to FIG. 28, in some embodiments, output of read control circuits 2803 is processed by an image processor or digital signal processor (DSP) 2804. In some embodiments, DSP 2804 is coupled to a general CPU 2805, which is coupled to traditional devices such as display 2809, input devices 2810, connectivity interfaces 2811 and memory 2808. In various embodiments, power control and delivery circuitry 2806 provides power and manages power consumption of components of 2800.

In some embodiments, general CPU 2805 includes one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the system 2800 to another device. The processing operations may also include operations related to audio I/O and/or display I/O.

In some embodiments, system 2800 includes an audio subsystem, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into system 2800, or connected to system 2800. In one embodiment, a user interacts with system 2800 by providing audio commands that are received and processed by processor 2805.

In some embodiments, power control and delivery circuit 2806 that manages battery power usage, charging of battery 2807, and features related to power saving operation. In some embodiments, power control and delivery circuit 2806 include DC-DC converters that can provide various controllable power supplies to the various components of system 2800.

In some embodiments, memory 2808 includes memory devices for storing information in system 2800. Memory 2808 can include nonvolatile (state does not change if power to the memory device is interrupted) and/or volatile (state is indeterminate if power to the memory device is interrupted) memory devices. Memory 2808 can store application data, user data, music, photos, documents, or other data, as well as system data (whether long-term or temporary) related to the execution of the applications and functions of system 2800.

In some embodiments, display 2809 represents hardware (e.g., display devices) and software (e.g., drivers) components that provide a visual and/or tactile display for a user to interact with system 2800. Display subsystem 2809 includes a display interface, which includes the particular screen or hardware device used to provide a display to a user. In one embodiment, the display interface includes logic separate from processor 2805 to perform at least some processing related to the display. In one embodiment, display subsystem 2809 includes a touch screen (or touch pad) device that provides both output and input to a user.

In some embodiments, I/O device 2810 represents hardware devices and software components related to interaction with a user. I/O device 2810 is operable to manage hardware that is part of an audio subsystem and/or display 2809. Additionally, I/O device 2810 illustrates a connection point for additional devices that connect to system 2800 through which a user might interact with the system. For example, devices that can be attached to system 2800 might include microphone devices, speaker or stereo systems, video systems or other display devices, keyboard or keypad devices, or other I/O devices for use with specific applications such as card readers or other devices.

In some embodiments, I/O device 2810 manages devices such as accelerometers, cameras, light sensors or other environmental sensors, or other hardware that can be included in system 2800. The input can be part of direct user interaction, as well as providing environmental input to the system to influence its operations (such as filtering for noise, adjusting displays for brightness detection, applying a flash for a camera, or other features).

In some embodiments, connectivity 2811 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 2811 includes multiple different types of connectivity. To generalize, the computing 2811 can have cellular connectivity and wireless connectivity. Cellular connectivity refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Connections 2811 include hardware interfaces and connectors, as well as software components (e.g., drivers, protocol stacks) to make peripheral connections. It will be understood that system 2800 could both be a peripheral device to other computing devices, as well as have peripheral devices connected to it. System 2800 may have a "docking" connector to connect to other computing devices for purposes such as managing (e.g., downloading and/or uploading, changing, synchronizing) content on system 2800. Additionally, a docking connector can allow system 2800 to connect to certain peripherals that allow the system 2800 to control content output, for example, to audiovisual or other systems.

In addition to a proprietary docking connector or other proprietary connection hardware, system 2800 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure is described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An apparatus comprising of: a first structure comprising piezoelectric material; a second structure adjacent to the first structure, wherein the second structure comprises a waveguide; a third structure comprising a thermal isolation material, wherein the third structure is adjacent to the second structure; a fourth structure comprising insulative material, wherein the fourth structure is adjacent to the third structure; and a fifth structure comprising one or more circuits, wherein the fifth structure is adjacent to the fourth structure.

Example 2

The apparatus of example 1, wherein the first and second structures are surrounded by a material, which is transparent or substantially transparent to a radiant infrared energy.

Example 3

The apparatus of example 2, wherein the transparent or substantially transparent material is adjacent to a surface of the third structure.

Example 4

The apparatus of example 3, wherein the transparent or substantially transparent material comprises one of air, vacuum, glass, or silicon.

Example 5

The apparatus of example 1, wherein the thermal isolation material includes one or more of: silicon oxide, silicon nitride, tantalum, or titanium.

Example 6

The apparatus of example 1, wherein the insulative material includes air or vacuum.

Example 7

The apparatus of example 1, wherein the one or more circuits include a delay locked loop or a phase locked loop.

Example 8

The apparatus of example 1, wherein the piezoelectric materials includes one or more of: Ba, Ti, Pb, Zr, K, Nb, Na, W, Zn, Fe, Bi, or F.

Example 9

The apparatus of example 1 wherein the waveguide includes one or more of: metal including one or more of copper, gold, graphene, or tungsten; dielectrics including Hf, Ga, or N; high-k dielectric; material with infrared absorption coefficient; or material with thermal conductivity and a Young's modulus that is sensitive to temperature change.

Example 10

The apparatus of example 1 wherein the one or more circuits are to perform: generate a first electric signal for the first structure; receive a second electric signal from the first structure; and process the second electric signal to determine a time of flight with reference to the waveguide.

Example 11

The apparatus of example 1, wherein the second structure is perpendicular to an x-y plane of the apparatus.

Example 12

The apparatus of example 1, wherein the second structure is extends parallel to the fifth structure.

Example 13

An apparatus comprising: an array of transducers; an array of waveguides, wherein each waveguide is adjacent to a corresponding transducer of the array of transducers; an array insulating regions, wherein each insulating region is under a corresponding transducer of the array of transducers; and a pixel electronic circuit coupled to the array of insulating regions.

Example 14

The apparatus of example 13, wherein the corresponding transducer includes one or more of: Barium titanate (BaTiO$_3$), Lead zirconate titanate (PZT), Potassium niobate (KNbO$_3$), Sodium tungstate (Na$_2$WO$_3$), Ba$_2$NaNb$_5$O$_5$, Pb$_2$KNb$_5$O$_{15}$, Zinc oxide (ZnO), Sodium potassium niobate ((KNa)NbO$_3$), Bismuth ferrite (BiFeO$_3$), Sodium niobate NaNbO$_3$, Bismuth titanate Bi$_4$Ti$_3$O$_{12}$, Sodium bismuth titanate Na$_{0.5}$Bi$_{0.5}$TiO$_3$, a bulk or nanostructured semiconductor crystal having non central symmetry including one or more materials from Group III-V and II-VI, Polyvinylidene fluoride (PVDF), or diphenylalanine peptide nanotubes (PNTs).

Example 15

The apparatus of example 13 wherein the corresponding transducer comprises a piezoelectric transducer, and wherein the piezoelectric transducer is to generate one or more ultrasonic waves which travel through the waveguide coupled with the piezoelectric transducer.

Example 16

The apparatus of example 15 wherein the piezoelectric transducer is to detect ultrasonic waves reflected inside the waveguide coupled with the piezoelectric transducer.

Example 17

The apparatus of example 13 wherein the corresponding waveguide includes one or more of: metal including one or more of copper, gold, graphene, or tungsten; dielectrics including HfO, or GaN; high-k dielectric; material with infrared absorption coefficient; or material with thermal conductivity and a Young's modulus that is sensitive to temperature change.

Example 18

The apparatus of example 13 wherein the pixel electronic circuit is to perform at least one of: generate an electric signal coupled to the piezoelectric transducer, switch between a transmitter circuit and a receiver circuit, generate a control signal to select a transmit or a receive circuit to couple to the piezoelectric transducer, receive an electric signal from the coupled piezoelectric transducer, or process the electric signal received from the coupled piezoelectric transducer.

Example 19

The apparatus of example 13, wherein the array of waveguides is perpendicular to an x-y plane, and wherein the transducer in along the x-y plane.

Example 20

The apparatus of example 13, wherein the array of waveguide is perpendicular to the array of transducers.

Example 21

The apparatus of example 13, wherein the array of waveguide is parallel to the array of transducers.

Example 22

The apparatus of example 13, each waveguide is to detect an infrared radiation of a different wavelength.

Example 23

A method of imaging Infrared light, comprising of: exciting one or more ultrasonic waves in a waveguide; measuring a Time of Flight (ToF) of the one or more ultrasonic waves in the waveguide, wherein the ToF is a function of an incident infrared light energy on the waveguide; and capturing an image from the ToF.

Example 24

The method of example 23 wherein measuring the ToF is accomplished by one of: a delayed locked loop; or a phased locked loop.

Example 25

The method of example 23, wherein exciting the ultrasonic waves in the waveguide comprises: generating the one or more ultrasonic waves by a piezoelectric transducer into the waveguide, wherein the piezoelectric transducer is coupled with the waveguide.

Example 26

The method of example 25, wherein measuring the Time of Flight (ToF) of the one or more ultrasonic wave in the waveguide further comprises: measuring a total time between the generation of the one or more ultrasonic waves and a generation of an electrical output by the piezoelectric transducer upon detecting a reflected ultrasonic pulse which traveled within the waveguide.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:
1. An apparatus comprising of:
a first structure comprising piezoelectric material;
a second structure adjacent to the first structure, wherein the second structure comprises a waveguide;

a third structure comprising a thermal isolation material, wherein the third structure is adjacent to the first structure;

a fourth structure comprising insulative material, wherein the fourth structure is adjacent to the third structure; and a fifth structure comprising one or more circuits, wherein the fifth structure is adjacent to the fourth structure.

2. The apparatus of claim 1, wherein the first and second structures are surrounded by a material which is transparent or substantially transparent to a radiant infrared energy.

3. The apparatus of claim 2, wherein the transparent or substantially transparent material is adjacent to a surface of the third structure.

4. The apparatus of claim 3, wherein the transparent or substantially transparent material comprises one of air, vacuum, glass, or silicon.

5. The apparatus of claim 1, wherein the thermal isolation material includes one or more of: silicon oxide, silicon nitride, tantalum, or titanium.

6. The apparatus of claim 1, wherein the insulative material includes air or vacuum.

7. The apparatus of claim 1, wherein the one or more circuits include a delay locked loop or a phase locked loop.

8. The apparatus of claim 1, wherein the piezoelectric material includes one or more of: Ba, Ti, Pb, Zr, K, Nb, Na, W, Zn, Fe, Bi, or F.

9. The apparatus of claim 1 wherein the waveguide includes one or more of:
   metal including one or more of copper, gold, graphene, or tungsten;
   dielectrics including Hf, Ga, or N; or
   high-k dielectric.

10. The apparatus of claim 1 wherein the one or more circuits are to perform:
    generate a first electric signal for the first structure;
    receive a second electric signal from the first structure; and
    process the second electric signal to determine a time of flight with reference to the waveguide.

11. The apparatus of claim 1, wherein the second structure is perpendicular to an x-y plane of the apparatus.

12. The apparatus of claim 1, wherein the second structure is parallel to the fifth structure.

13. An apparatus comprising:
    an array of transducers;
    an array of waveguides, wherein an individual waveguide is adjacent to a corresponding transducer of the array of transducers;
    an array of insulating regions, wherein an individual insulating region is under a corresponding transducer of the array of transducers; and
    a pixel electronic circuit coupled to the array of insulating regions.

14. The apparatus of claim 13, wherein the corresponding transducer includes one or more of: Barium titanate (BaTiO$_3$), Lead zirconate titanate (PZT), Potassium niobate (KNbO$_3$), Sodium tungstate (Na$_2$WO$_3$), Ba$_2$NaNb$_5$O$_5$, Pb$_2$KNb$_5$O$_{15}$, Zinc oxide (ZnO), Sodium potassium niobate ((KNa)NbO$_3$), Bismuth ferrite (BiFeO$_3$), Sodium niobate NaNbO$_3$, Bismuth titanate Bi$_4$Ti$_3$O$_{12}$, Sodium bismuth titanate Na$_{0.5}$Bi$_{0.5}$TiO$_3$, a bulk or nanostructured semiconductor crystal having non central symmetry including one or more materials from Group III-V and II-VI, Polyvinylidene fluoride (PVDF), or diphenylalanine peptide nanotubes (PNTs).

15. The apparatus of claim 13 wherein the corresponding transducer comprises a piezoelectric transducer, and wherein the piezoelectric transducer is to generate one or more ultrasonic waves, which travel through a waveguide from among the array of waveguides.

16. The apparatus of claim 15 wherein the piezoelectric transducer is to detect ultrasonic waves reflected inside a waveguide from among the array of waveguides.

17. The apparatus of claim 13 wherein the waveguide among the array of waveguides includes one or more of:
    metal including one or more of copper, gold, graphene, or tungsten;
    dielectrics including HfO, or GaN; or
    high-k dielectric.

18. The apparatus of claim 13 wherein the pixel electronic circuit is to perform at least one of:
    generate an electric signal coupled to a piezoelectric transducer, wherein the piezoelectric transducer is coupled to a waveguide from among the array of waveguides,
    switch between a transmitter circuit and a receiver circuit,
    generate a control signal to select a transmit or a receive circuit to couple to the piezoelectric transducer,
    receive an electric signal from the coupled piezoelectric transducer, or
    process the electric signal received from the piezoelectric transducer.

19. The apparatus of claim 13, wherein the array of waveguides is perpendicular to an x-y plane, and wherein the transducer is along the x-y plane.

20. The apparatus of claim 13, wherein the array of waveguide is perpendicular to the array of transducers.

21. The apparatus of claim 13, wherein the array of waveguide is parallel to the array of transducers.

22. The apparatus of claim 13, wherein the individual waveguide is to detect an infrared radiation of a different wavelength.

* * * * *